US012009465B1

(12) United States Patent
Hurni et al.

(10) Patent No.: US 12,009,465 B1
(45) Date of Patent: *Jun. 11, 2024

(54) LED ARRAY HAVING TRANSPARENT SUBSTRATE WITH CONDUCTIVE LAYER FOR ENHANCED CURRENT SPREAD

(71) Applicant: META PLATFORMS TECHNOLOGIES, LLC, Menlo Park, CA (US)

(72) Inventors: Christophe Antoine Hurni, Seattle, WA (US); John Michael Goward, Redmond, WA (US); Chloe Astrid Marie Fabien, Seattle, WA (US)

(73) Assignee: META PLATFORMS TECHNOLOGIES, LLC, Menlo Park, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/681,203

(22) Filed: Feb. 25, 2022

Related U.S. Application Data

(63) Continuation of application No. 16/696,811, filed on Nov. 26, 2019, now Pat. No. 11,296,266.

(51) Int. Cl.
*H01L 33/62* (2010.01)
*G02B 27/01* (2006.01)
(Continued)

(52) U.S. Cl.
CPC ............ *H01L 33/62* (2013.01); *G02B 27/017* (2013.01); *H01L 25/0753* (2013.01);
(Continued)

(58) Field of Classification Search
CPC ..... H01L 33/62; H01L 25/0753; H01L 33/58; H01L 2933/0066
See application file for complete search history.

(56) References Cited

U.S. PATENT DOCUMENTS 9,653,642 B1    5/2017  Raring et al.
11,296,266 B2 *  4/2022  Hurni ................... H01L 27/153
(Continued)

FOREIGN PATENT DOCUMENTS

EP          2264793 A2    12/2010
WO       2018035322 A1     2/2018

OTHER PUBLICATIONS

International Preliminary Report on Patentability for International Application No. PCT/US2020/056722, dated Jun. 9, 2022, 8 pages.
(Continued)

*Primary Examiner* — Jay C Chang
*Assistant Examiner* — Mikka Liu
(74) *Attorney, Agent, or Firm* — Weaver Austin Villeneuve & Sampson LLP

(57) ABSTRACT

In a flip-chip LED assembly having an array of LEDs formed on the same substrate, different LEDs of the array have different distances to the n-contacts of the assembly. This may cause current crowding as current has to spread from the n-contacts through the substrate to each the farthest LEDs of the LED array, requiring LEDs that are farther away to be driven with a higher voltage in order to receive a desired amount of current. To spread current more evenly through the LED assembly and reduce a voltage difference between the closest and farthest LEDs of the array, a current spreading layer having a conductive material (e.g., a conductive oxide) is formed on a surface of the substrate of the LED assembly. The current spreading layer may be a bulk layer or be patterned to increase light extraction from the LEDs of the array.

20 Claims, 18 Drawing Sheets

(51) Int. Cl.
  *H01L 25/075* (2006.01)
  *H01L 33/00* (2010.01)
  *H01L 33/58* (2010.01)

(52) U.S. Cl.
  CPC .......... *H01L 33/0095* (2013.01); *H01L 33/58* (2013.01); *G02B 2027/0178* (2013.01); *H01L 2933/0066* (2013.01)

(56) References Cited

U.S. PATENT DOCUMENTS

| | | |
|---|---|---|
| 2005/0035354 A1 | 2/2005 | Lin et al. |
| 2006/0284190 A1 | 12/2006 | Zimmerman et al. |
| 2007/0206651 A1 | 9/2007 | Tsai et al. |
| 2009/0072259 A1 | 3/2009 | Chen et al. |
| 2011/0114988 A1 | 5/2011 | Sabathil et al. |
| 2011/0272719 A1 | 11/2011 | Chen et al. |
| 2017/0358714 A1* | 12/2017 | Seong ................ H01L 33/20 |
| 2019/0267357 A1 | 8/2019 | Iguchi et al. |
| 2019/0356907 A1 | 11/2019 | Iguchi |
| 2020/0035748 A1* | 1/2020 | Xia ................ H01L 27/156 |

OTHER PUBLICATIONS

International Search Report and Written Opinion for International Application No. PCT/US2020/056722, dated Feb. 8, 2021, 10 Pages.

\* cited by examiner

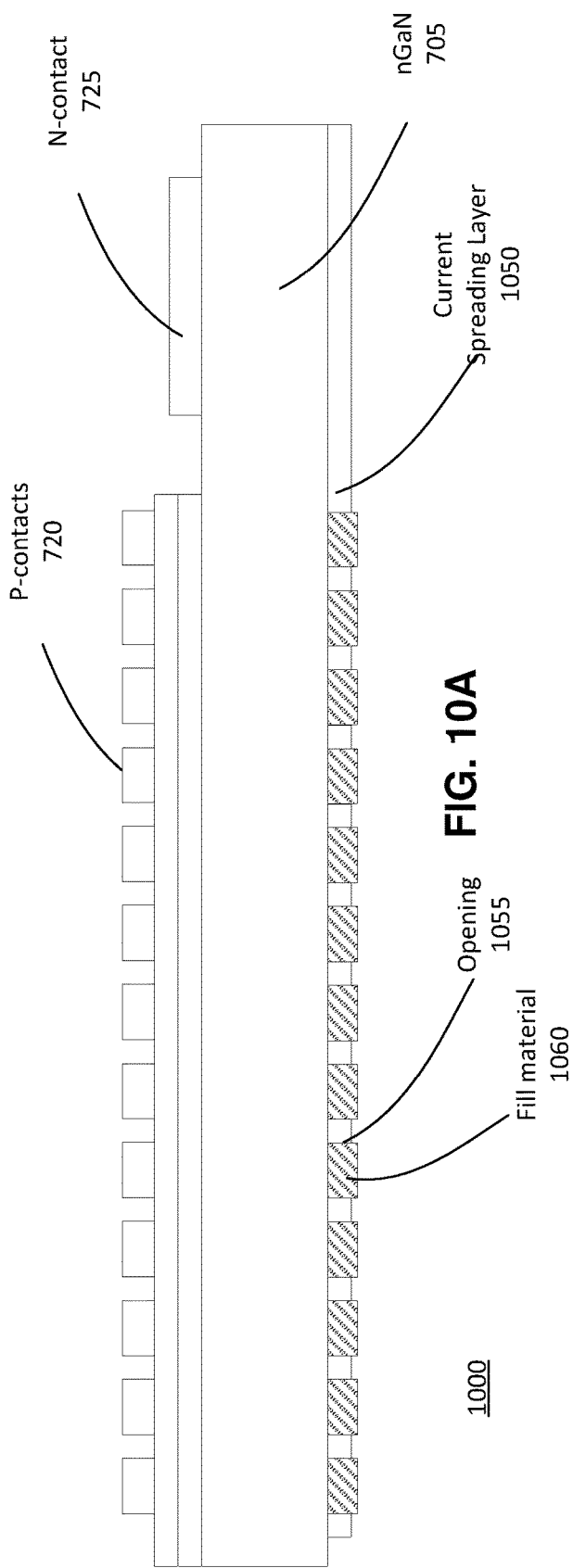

LED ARRAY HAVING TRANSPARENT SUBSTRATE WITH CONDUCTIVE LAYER FOR ENHANCED CURRENT SPREAD

CROSS REFERENCE TO RELATED APPLICATIONS

This application is a continuation of co-pending U.S. application Ser. No. 16/696,811, filed Nov. 26, 2019, which is incorporated by reference in its entirety.

BACKGROUND

This disclosure relates to structure and operation of an LED assembly, and in particular to a flip-clip LED assembly. A display device is often used in a virtual reality (VR) or augmented-reality (AR) system as a head-mounted display or a near-eye display. In some display devices, light generated by an LED assembly is projected to locations of an image field within a display period to form an image. A flip-chip LED assembly may comprise an array of LEDs each having a corresponding p-contact, but sharing one or more n-contacts. The electrical resistance from each pixel will depend on how far it is from the n-contacts. This can create large differences in voltage between LEDs that are close and LEDs that are far from the n-contacts.

SUMMARY

Embodiments described herein generally relate to an LED assembly (e.g., a flip-chip LED assembly) having an array of LEDs. Some LEDs of the array will be located close to an n-contact and some will be located far from an n-contact. This may cause current crowding as current has to spread from the n-contacts through the substrate to each LEDs of the LED array, inducing a higher voltage for the LEDs that are far from an n-contact. To reduce current crowding, a current spreading layer having a conductive material (e.g., a conductive oxide) may be formed on a surface of the substrate of the LED assembly, in order to spread current more evenly through the LED assembly and reduce a voltage difference between the closest and farthest LEDs from the n-contact of the array. The current spreading layer may be a continuous layer or be patterned, according to some embodiments, for example to increase light extraction from the LEDs of the array.

In some embodiments, an LED assembly is disclosed. The LED assembly comprises a substrate, an array of LEDs disposed on the first surface of the substrate, each LED of the array having a corresponding first contact, a second contact formed on a first surface of the substrate, and configured so that when current flows from the first to the second contact, the LED will emit light. The LED assembly may further comprise a current spreading layer formed on a second surface of the substrate. In some embodiments, the second surface of the substrate is opposite to the first surface of the substrate.

In some embodiments, the substrate comprises an epitaxial LED structure having an n-type layer, a light emitting material, and a p-type layer. The LED assembly comprises one or more n-contacts formed on a first surface of or within the n-type layer, and an array of LEDs, wherein each LED of the array of LEDs corresponds to an individual p-contact on a first surface of the p-type layer, and is configured to emit light when current is applied between the p-contact and at least one of the one or more n-contacts. A current spreading layer is formed on a second surface of the n-type layer, wherein the current spreading layer reduces the voltage difference between the different LEDs of the LED array during operation of the LED assembly.

In some embodiments, the current spreading layer comprises a conductive oxide such as indium tin oxide (ITO). The current spreading layer may have a resistivity of 0.001 Ohm cm or less, and may have a thickness of 50 nm or more.

In some embodiments, the substrate is an n-type semiconductor (ie n-GaN, n-GaAs, etc), where the growth substrate was removed or partially removed.

In some embodiments, the first contact of the LED assembly is an n-contact, and second contacts are p-contacts. The array of LEDs may form a pixel array of a display area.

In some embodiments, the pixels are defined by the p-contacts, and in other embodiments, the pixels are defined by p-contact and etched or partially etched mesas on the p-layers, quantum well material, and the n-layers to further confine the current.

In some embodiments, the current spreading layer is formed with a plurality of openings, each opening corresponding to an LED of the LED array. In some embodiments, an optically transmissive material is disposed within the plurality of openings. In some embodiments, the optically transmissive material disposed within each opening forms a microlens.

In some embodiments, the current spreading layer comprises conductive oxide material deposited into one or more trenches formed on the second surface of the substrate. The one or more trenches may be formed at locations on the second surface of the substrate corresponding to spaces between the array of LEDs. In some embodiments, the current spreading layer is formed between the substrate layer and a second substrate layer.

BRIEF DESCRIPTION OF THE DRAWINGS

FIG. 10A illustrates a side cross-sectional view of an LED assembly having a patterned current spreading layer having a second, fill material, in accordance with some embodiments.

FIG. 10B illustrates a frontal view of the patterned current spreading layer used in FIG. 10A.

Figure 1:
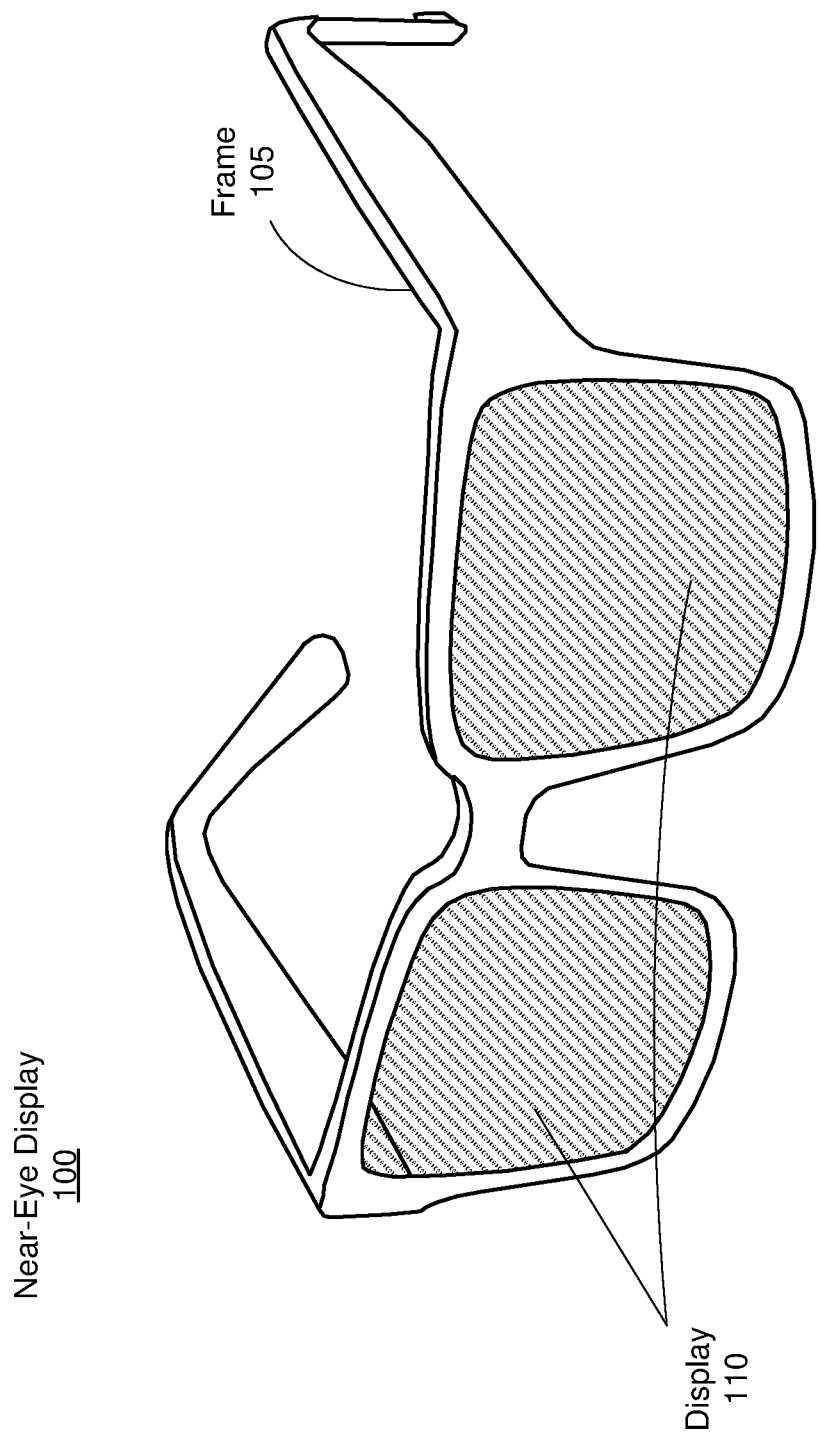
FIG. 1 is a perspective view of a near-eye-display (NED), in accordance with an embodiment.

The figures depict embodiments of the present disclosure for purposes of illustration only.

DETAILED DESCRIPTION

Embodiments relate to an LED assembly comprising an array of LEDs, each corresponding to a respective first contact (e.g., p-contact), formed on the same substrate (e.g., n-type substrate) and sharing one or more second contacts (e.g., n-contact). In some embodiments, the LED assembly is a flip-chip LED assembly where both n-contacts and p-contacts are formed on the same side.

Different LEDs of the LED array will have different distances to the n-contacts of the LED assembly. For example, the n-contacts of the LED assembly may be located near a periphery or edge of the LED array, such that a distance between LEDs near the center of the array to the n-contacts will be greater than the distance of LEDs near the edge of the array to the n-contacts. This may cause current crowding because current has to spread from the n-contacts through the substrate to each the farthest LEDs of the LED array. As such, LEDs that are farther from the n-contacts may require a higher voltage when driven with a desired amount of current. A large voltage difference between the edge LEDs and the center LEDs is undesirable both for backplanes/drivers and integration. In some embodiments, in order to lower the voltage difference between the different LEDs of the arrays, the LED assembly comprises a current spreading layer having a conductive material (e.g., a conductive oxide) on a surface of the substrate, in order to reduce a voltage difference between the LEDs at different locations of the LED array.

Embodiments of the invention may include or be implemented in conjunction with an artificial reality system. Artificial reality is a form of reality that has been adjusted in some manner before presentation to a user, which may include, e.g., a virtual reality (VR), an augmented reality (AR), a mixed reality (MR), a hybrid reality, or some combination and/or derivatives thereof. Artificial reality content may include completely generated content or generated content combined with captured (e.g., real-world) content. The artificial reality content may include video, audio, haptic feedback, or some combination thereof, and any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, e.g., create content in an artificial reality and/or are otherwise used in (e.g., perform activities in) an artificial reality. The artificial reality system that provides the artificial reality content may be implemented on various platforms, including a head-mounted display (HMD) connected to a host computer system, a standalone HMD, a mobile device or computing system, or any other hardware platform capable of providing artificial reality content to one or more viewers.

Near-Eye Display

Figure (FIG. 1 is a diagram of a near-eye display (NED) 100, in accordance with an embodiment. The NED 100 presents media to a user. Examples of media presented by the NED 100 include one or more images, video, audio, or some combination thereof. In some embodiments, audio is presented via an external device (e.g., speakers and/or headphones) that receives audio information from the NED 100, a console (not shown), or both, and presents audio data based on the audio information. The NED 100 may operate as a VR NED. However, in some embodiments, the NED 100 may be modified to also operate as an augmented reality (AR) NED, a mixed reality (MR) NED, or some combination thereof. For example, in some embodiments, the NED 100 may augment views of a physical, real-world environment with computer-generated elements (e.g., images, video, sound, etc.).

The NED 100 shown in FIG. 1 includes a frame 105 and a display 110. The frame 105 includes one or more optical elements which together display media to users. The display 110 is configured for users to see the content presented by the NED 100. As discussed below in conjunction with FIG. 2, the display 110 includes at least a source assembly to generate an image light to present media to an eye of the user. The source assembly includes, e.g., a light source, an optics system, or some combination thereof.

FIG. 1 is only an example of a VR system. However, in alternate embodiments, FIG. 1 may also be referred to as a Head-Mounted-Display (HMD).

Figure 2:
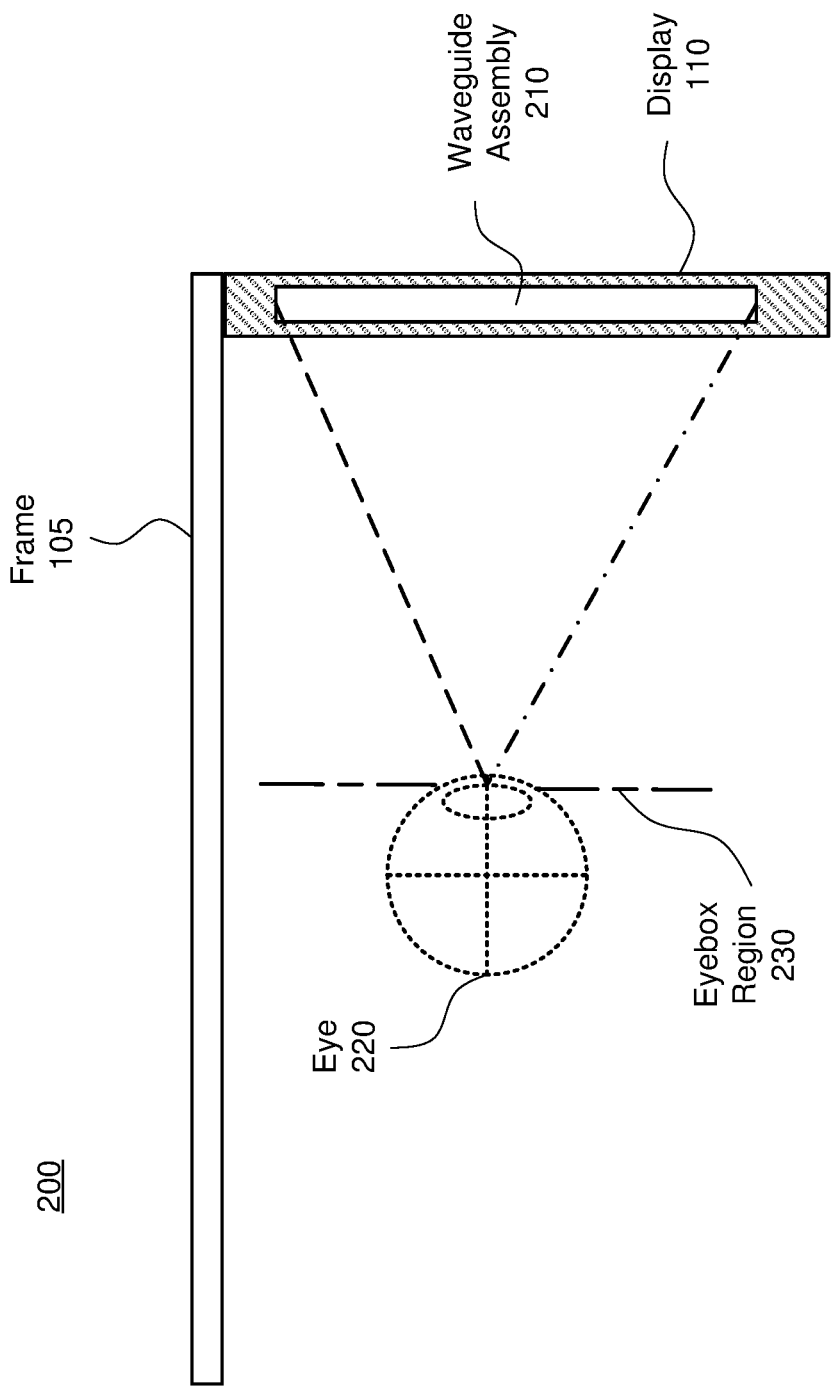
FIG. 2 is a cross-section of an eyewear of the NED illustrated in FIG. 1, in accordance with an embodiment.

FIG. 2 is a cross section 200 of the NED 100 illustrated in FIG. 1, in accordance with an embodiment. The cross section 200 illustrates at least one waveguide assembly 210. An exit pupil is a location where the eye 220 is positioned in an eyebox region 230 when the user wears the NED 100. In some embodiments, the frame 105 may represent a frame of eye-wear glasses. For purposes of illustration, FIG. 2 shows the cross section 200 associated with a single eye 220 and a single waveguide assembly 210, but in alternative embodiments not shown, another waveguide assembly which is separate from the waveguide assembly 210 shown in FIG. 2, provides image light to another eye 220 of the user.

The waveguide assembly 210, as illustrated below in FIG. 2, directs the image light to the eye 220 through the exit pupil. The waveguide assembly 210 may be composed of one or more materials (e.g., plastic, glass, etc.) with one or more refractive indices that effectively minimize the weight and widen a field of view (hereinafter abbreviated as 'FOV') of the NED 100. In alternate configurations, the NED 100 includes one or more optical elements between the waveguide assembly 210 and the eye 220. The optical elements may act (e.g., correct aberrations in image light emitted from the waveguide assembly 210) to magnify image light emitted from the waveguide assembly 210, some other optical adjustment of image light emitted from the waveguide assembly 210, or some combination thereof. The example for optical elements may include an aperture, a Fresnel lens, a convex lens, a concave lens, a filter, or any other suitable optical element that affects image light.

Figure 3:
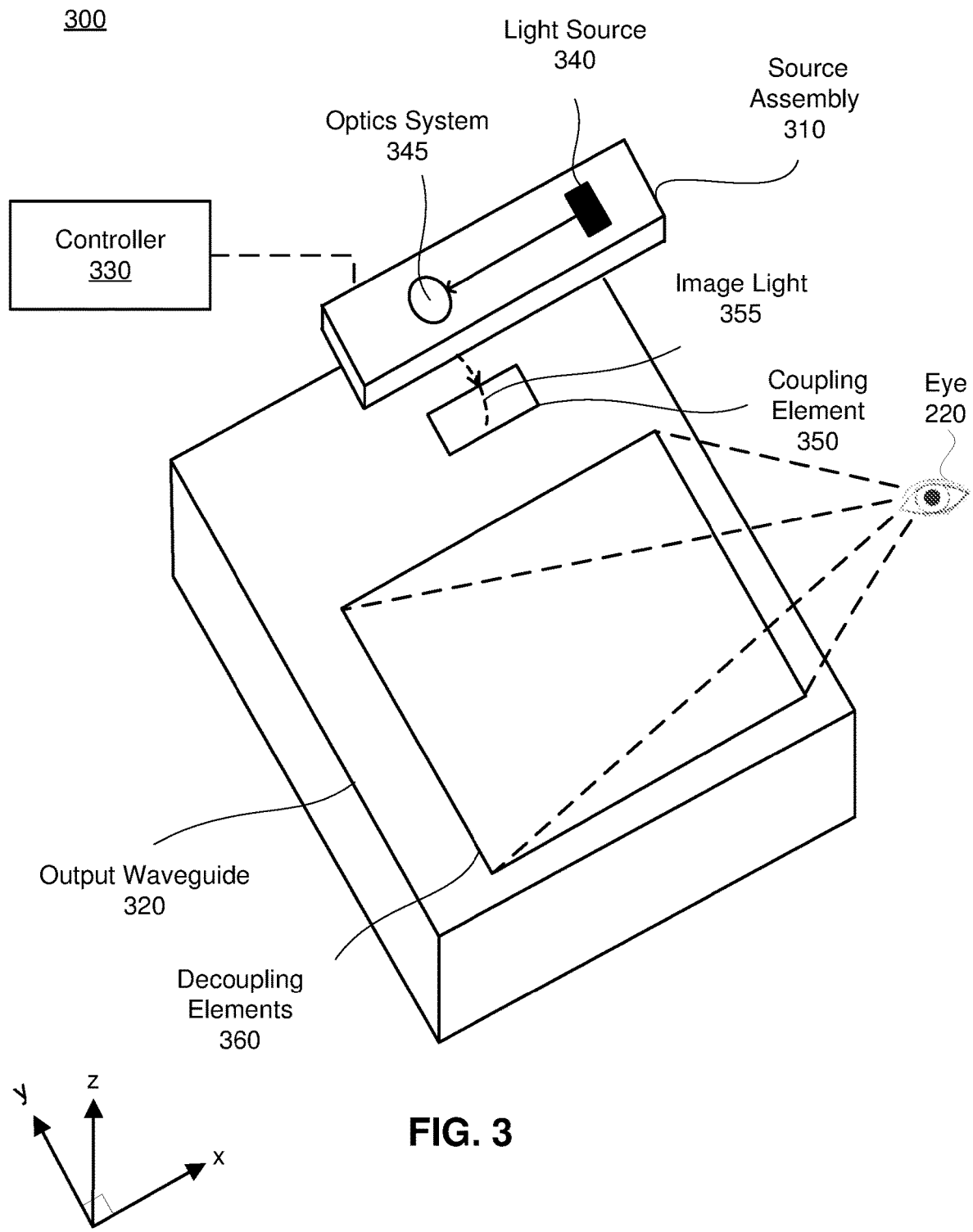
FIG. 3 is a perspective view of a display device, in accordance with an embodiment.

FIG. 3 illustrates a perspective view of a display device 300, in accordance with an embodiment. In some embodiments, the display device 300 is a component (e.g., the waveguide assembly 210 or part of the waveguide assembly 210) of the NED 100. In alternative embodiments, the display device 300 is part of some other NEDs, or another system that directs display image light to a particular location. Depending on embodiments and implementations, the display device 300 may also be referred to as a waveguide display and/or a scanning display. However, in other embodiment, the display device 300 does not include a waveguide or a scanning mirror. For example, the display device 300 can include a two-dimensional matrix of light emitters that direct project light on an image field such as a screen without a scanning mirror. In another embodiment, the image emitted by the two-dimensional matrix of light emitters may be magnified by an optical assembly (e.g., lens) before the light arrives a waveguide or a screen.

For a particular embodiment that uses a waveguide and an optical system, the display device 300 may include a source assembly 310, an output waveguide 320, and a controller 330. The display device 300 may provide images for both eyes or for a single eye. For purposes of illustration, FIG. 3 shows the display device 300 associated with a single eye 220. Another display device (not shown), separated (or partially separated) from the display device 300, provides image light to another eye of the user. In a partially separated system, one or more components may be shared between display devices for each eye.

The source assembly 310 generates image light 355. The source assembly 310 includes a light source 340 and an optics system 345. The light source 340 is an optical component that generates image light using a plurality of light emitters arranged in a matrix. The light source 340 generates an image light including, but not restricted to, a Red image light, a Blue image light, a Green image light, an infra-red image light, etc.

The optics system 345 performs a set of optical processes, including, but not restricted to, focusing, combining, conditioning, and/or scanning processes on the image light generated by the light source 340. In some embodiments, the optics system 345 includes a combining assembly, a light conditioning assembly, a waveguide assembly, and/or a scanning mirror assembly, as described below in detail in conjunction with FIG. 4. The source assembly 310 generates and outputs an image light 355 to a coupling element 350 of the output waveguide 320.

The output waveguide 320 is an optical waveguide that outputs image light to an eye 220 of a user. The output waveguide 320 receives the image light 355 at one or more coupling elements 350, and guides the received input image light to one or more decoupling elements 360. The coupling element 350 may be, e.g., a diffraction grating, a holographic grating, some other element that couples the image light 355 into the output waveguide 320, or some combination thereof. For example, in embodiments where the coupling element 350 is diffraction grating, the pitch of the diffraction grating is chosen such that total internal reflection occurs, and the image light 355 propagates internally toward the decoupling element 360. The pitch of the diffraction grating may be in the range of 300 nm to 600 nm.

The decoupling element 360 decouples the total internally reflected image light from the output waveguide 320. The decoupling element 360 may be, e.g., a diffraction grating, a holographic grating, some other element that decouples image light out of the output waveguide 320, or some combination thereof. For example, in embodiments where the decoupling element 360 is a diffraction grating, the pitch of the diffraction grating is chosen to cause incident image light to exit the output waveguide 320. An orientation and position of the image light exiting from the output waveguide 320 are controlled by changing an orientation and position of the image light 355 entering the coupling element 350. The pitch of the diffraction grating may be in the range of 300 nm to 600 nm.

The output waveguide 320 may be composed of one or more materials that facilitate total internal reflection of the image light 355. The output waveguide 320 may be composed of e.g., silicon, plastic, glass, or polymers, or some combination thereof. The output waveguide 320 has a relatively small form factor. For example, the output waveguide 320 may be approximately 50 mm wide along X-dimension, 30 mm long along Y-dimension and 0.5-1 mm thick along Z-dimension.

The controller 330 controls the imaging operations of the source assembly 310. The controller 330 determines imaging instructions for the source assembly 310 based at least on the one or more display instructions. Display instructions are instructions to render one or more images. In some embodiments, display instructions may simply be an image file (e.g., bitmap). The display instructions may be received from, e.g., a console of a VR system (not shown here). Imaging instructions are instructions used by the source assembly 310 to generate image light 355. The imaging instructions may include, e.g., a type of a source of image light (e.g., monochromatic, polychromatic), one or more illumination parameters, one or more scanning parameters (e.g., a scanning rate, an orientation of a scanning apparatus, etc.), or some combination thereof. The controller 330 includes a combination of hardware, software, and/or firmware not shown here so as not to obscure other aspects of the disclosure.

Figure 4:
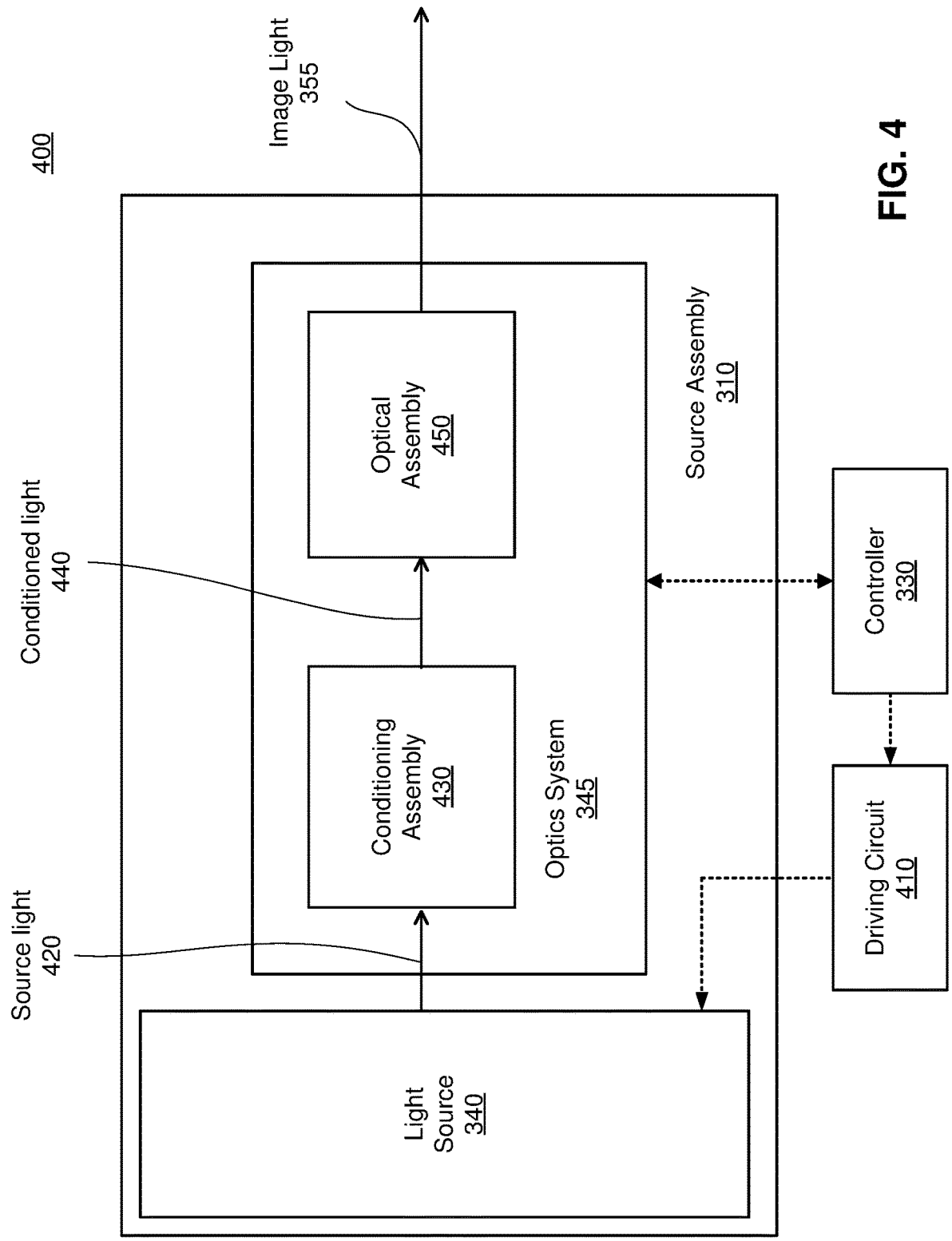
FIG. 4 illustrates a block diagram of a source assembly, in accordance with an embodiment.

FIG. 4 illustrates a cross section 400 of the source assembly 310, in accordance with an embodiment. The controller 330 provides imaging instructions which may include clock signals and pixel data to a driving circuit 410. The driving circuit 410 modulates the pixel data and generate driving signals to drive the light source 340 to generate light in accordance with imaging instructions from a controller 330.

The light source 340 may generate a spatially coherent or a partially spatially coherent image light. The light source 340 may include multiple light emitters. The light emitters can be microLEDs (μLEDs), vertical cavity surface emitting laser (VCSEL) devices, light emitting diodes (LEDs), tunable lasers, and/or some other light-emitting devices. In one embodiment, the light source 340 includes a matrix of microLEDs. The light source 340 emits light in a visible band (e.g., from about 390 nm to 700 nm). The light source 340 emits light in accordance with one or more illumination parameters set by or received from the controller 330. An illumination parameter is an instruction used by the light source 340 to generate light. An illumination parameter may include, e.g., source wavelength, pulse rate, pulse amplitude, beam type (continuous or pulsed), other parameter(s) that affect the emitted light, or some combination thereof. The light source 340 emits source light 420. In some embodiments, the source light 420 includes multiple beams of Red light, Green light, and Blue light, or some combination thereof.

The optics system 345 includes one or more optical components that condition the light from the light source 340. Conditioning light from the light source 340 may include, e.g., expanding, collimating, adjusting orientation in accordance with instructions from the controller 330, some other adjustment of the light, or some combination thereof. The one or more optical components may include, e.g., lenses, mirrors, apertures, gratings, or some combination thereof. Light emitted from the optics system 345 is referred to as an image light 355. The optics system 345 outputs the image light 355 at a particular orientation (in accordance with the imaging instructions) toward the output waveguide 320 (shown in FIG. 3).

The optics system 345 may include a light conditioning assembly 430 and an optical assembly 450. The light conditioning assembly 430 conditions the source light 420 and emits conditioned light 440 to the optical assembly 450. The conditioned light 440 is light conditioned for incidence on the optical assembly 450. The light conditioning assembly 430 includes one or more optical components that condition the light from the light source 340. Conditioning light from the light source 340 may include, e.g., expanding, collimating, correcting for one or more optical errors (e.g., field curvature, chromatic aberration, etc.), some other adjustment of the light, or some combination thereof. The light conditioning assembly 430 conditions the source light 420 and emits the conditioned light 440 to the optical assembly 450.

The optical assembly 450 redirects image light via its one or more reflective and/or refractive portions. Where the image light is redirected toward is based on specific orientations of the one or more reflective and/or refractive portions. In some embodiments, the optical assembly 450 includes a waveguide that directs the conditioned light 440 to a display area viewed by the user, or to another waveguide such as the output waveguide 320 illustrated in FIG. 3. In some embodiments, the optical assembly 450 includes one or more scanning mirrors able to perform a raster scan (horizontally, or vertically), a biresonant scan, or some combination thereof. In some embodiments, the optical assembly 450 may perform a controlled vibration along the horizontal and/or vertical directions with a specific frequency of oscillation to scan along two dimensions and generate a two-dimensional projected line image of the media presented to user's eyes. In other embodiments, the optical assembly 450 may also include lens that serve similar or same function as one or more scanning mirror. In some embodiments, the optical assembly 450 includes a galvanometer mirror. For example, the galvanometer mirror may represent any electromechanical instrument that indicates that it has sensed an electric current by deflecting a beam of image light with one or more mirrors. The galvanometer mirror may scan in at least one orthogonal dimension to generate the image light 355. The image light 355 from the galvanometer mirror represents a two-dimensional line image of the media presented to the user's eyes.

The controller 330 controls the operations of light source 340 and the optical assembly 450. The operations performed by the controller 330 includes taking content for display, and dividing the content into discrete sections. The controller 330 instructs the light source 340 to sequentially present the discrete sections using individual source elements corresponding to a respective row in an image ultimately displayed to the user. In embodiments where the optical assembly 450 comprises a scanning mirror, the controller 330 instructs the optical assembly 450 to scan the presented discrete sections to different areas of a coupling element of the output waveguide 320 (shown in FIG. 3). Accordingly, at the exit pupil of the output waveguide 320, each discrete portion is presented in a different location. While each discrete section is presented at different times, the presentation and scanning of the discrete sections occur fast enough such that a user's eye integrates the different sections into a single image or series of images. The controller 330 may also provide imaging instructions to the light source 340 that include an address corresponding to an individual source element of the light source 340 and/or an electrical bias applied to the individual source element.

The image light 355 couples to the output waveguide 320 as described above with reference to FIG. 3.

Waveguide and Viewing Plane

Figure 5:
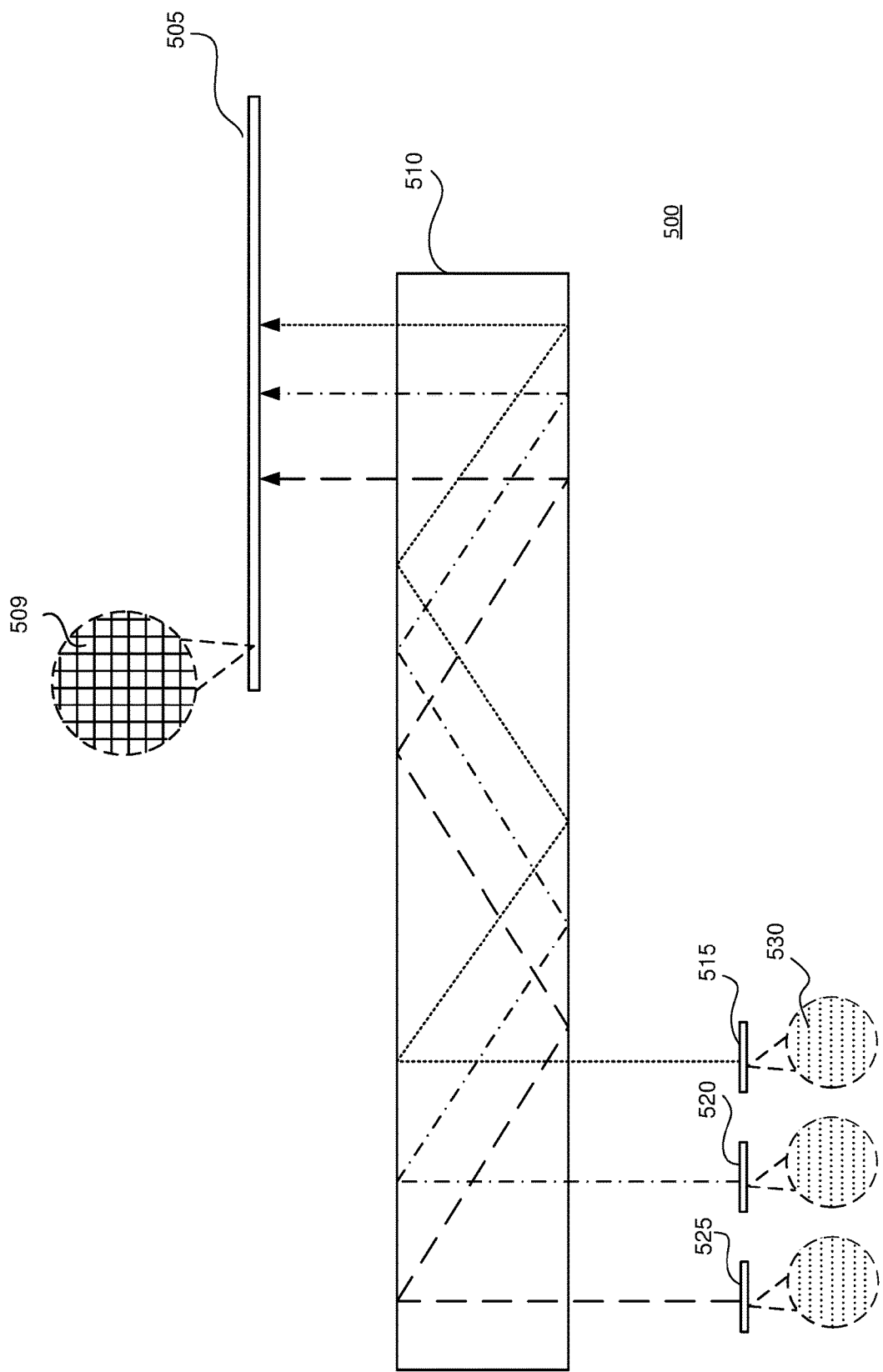
FIG. 5 illustrates a display device having a plurality of LED assemblies and a waveguide, in accordance with same embodiments.

FIG. 5 illustrates a display device 500 having a plurality of LED assemblies and a waveguide, in accordance with same embodiments. The display device 500 may correspond to the near-eye display 100 or another scan-type display device. The light source of the display device may comprise a plurality of LED assemblies 515, 520, and 525. Each LED assembly comprises an array of LEDs of a respective color channel. For example, the LED assemblies 515, 520, and 525 may correspond a red LED array, a green LED array, and a blue LED array, respectively. The LED assemblies may collectively correspond to the light source 340 shown in FIG. 4, or may be used in other display devices.

Each of the LED assemblies 515, 520, and 525 includes a 2-dimensional array of LEDs 530 configured to emit a set of collimated beams of light. In some embodiments, each of the LEDs 530 may correspond to a pixel or a sub-pixel of the display. Before reaching the waveguide 510, the light may be conditioned by different optical devices such as the conditioning assembly 430 (shown in FIG. 4 but not shown in FIG. 5). The waveguide 510 guides and projects the light from the LED assemblies to the viewing plane 505. In some embodiments, the waveguide 510 aligns and/or combines the light emitted from each of the LED assembly 515, 520, and 525, such that light emitted from corresponding LEDs 530 of each LED assembly are combined to form a pixel of the display. The waveguide 510 may further magnifies the emitted light, such that the light from the LED assemblies is fitted to the viewing plane 505.

The viewing plane 505 is an area that receives the light emitted from the LED assemblies. For example, the viewing plane 505 may correspond to a portion of the coupling element 350 or a portion of the decoupling element 360 in FIG. 3. In some cases, a viewing plane is not an actual physical structure but is an area to which the image light is projected and which the image is formed. The viewing plane 505 may be spatially defined by a matrix of pixel locations 509 in rows and columns. A pixel location 509 here refers to a single pixel. The pixel locations 509 (or simply the pixels) in the viewing plane 505 sometimes may not actually be additional physical structure. Instead, the pixel locations 509 may be spatial regions that divide the viewing plane 505. Also, the sizes and locations of the pixel locations may depend on the projection of the light from the LED assemblies. In some cases, a pixel location 509 may be subdivided spatially into subpixels (not shown). For example, a pixel location may include a Red subpixel, a Green subpixel, and a Blue subpixel. The Red subpixel corresponds to a location at which one or more Red light beams are projected, etc. When subpixels are present, the color of a pixel is based on the temporal and/or spatial average of the subpixels. In some embodiments, the number of rows and columns of LED array of each LED assembly may or be the same as the number of rows and columns of the pixel locations 509 in the viewing plane 505.

The terms rows and columns may describe two relative spatial relationships of elements. While, for the purpose of simplicity, a column described herein is normally associated with a vertical line of elements, it should be understood that a column does not have to be arranged vertically (or longitudinally). Likewise, a row does not have to be arranged horizontally (or laterally). A row and a column may also sometimes describe an arrangement that is non-linear. Rows and columns also do not necessarily imply any parallel or perpendicular arrangement. Sometimes a row or a column may be referred to as a line.

The display device may operate in predefined display periods. A display period may correspond to a duration of time in which an image is formed. For example, a display period may be associated with the frame rate (e.g., a reciprocal of the frame rate).

While the embodiments of display devices in FIGS. 3-5 are shown to include a waveguide and an optical assembly, other embodiments of display devices may omit the waveguide and/or the optical assembly. For example, in some embodiments, the light emitters may be arranged in a two-dimensional matrix that project light directly onto an image field without going through an optical assembly. In one of those embodiments, the light emitters may project simultaneously onto the entire image field without scanning. An optical assembly that magnifies the dimensional of the image may or may not be used, depending on the implement. Likewise, in one embodiment, a screen may be used in place of a waveguide. In embodiments, a display period may be referred to a frame. The rate of changing of the display period may be referred to the frame rate.

Led Assembly

As discussed above, in some embodiments, the light source for a display (e.g., the light source 340 for an NED 100) may comprise one or more LEDs. In some embodiments, the one or more LEDs are arranged into an LED assembly or array. For example, the light source may comprise a plurality of LEDs arranged in a linear arrangement, a two-dimensional matrix arrangement, and/or the like. In some embodiments, the light source may comprise a plurality of LED assemblies, each corresponding to a different color channel (e.g., a first LED assembly corresponding to a red color channel, a second LED assembly corresponding to a green color channel, and a third LED assembly corresponding to a blue color channel).

Figure 6A:
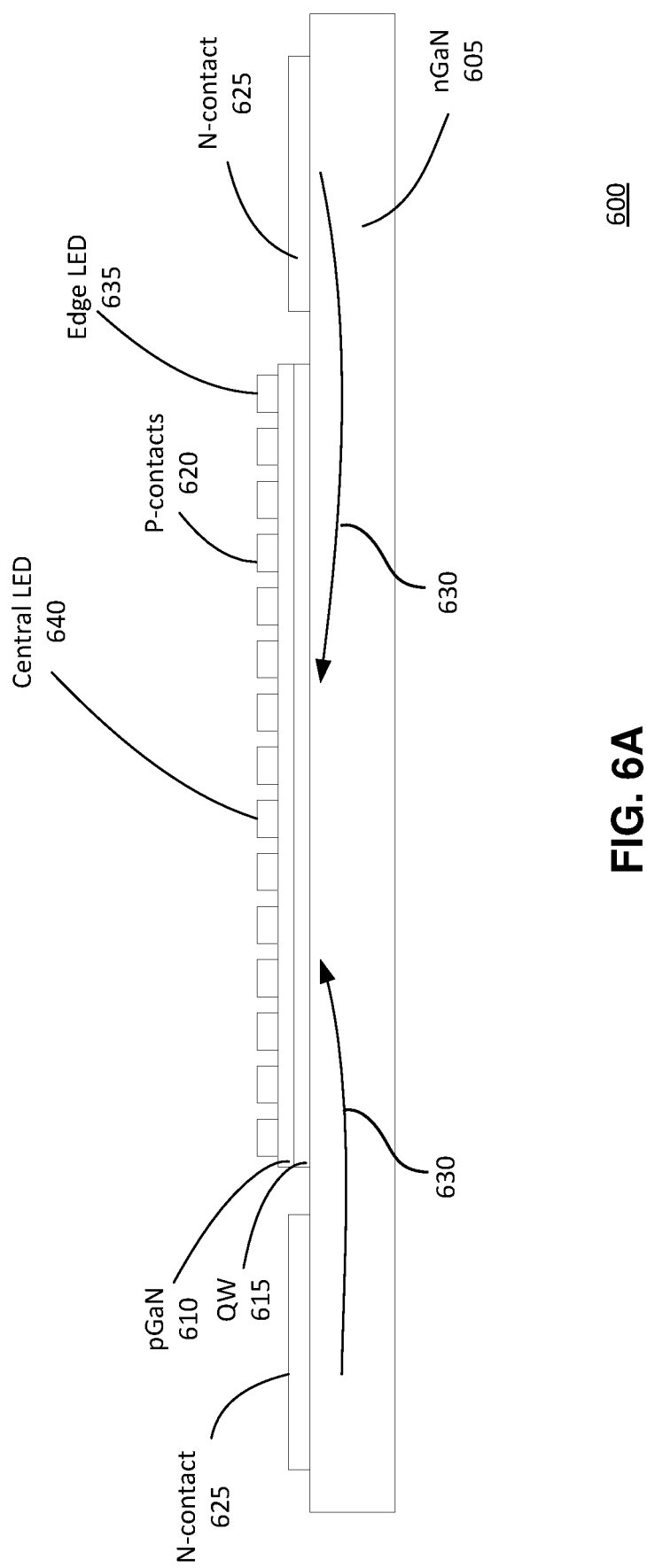
FIG. 6A illustrates a side view of an LED assembly, in accordance with some embodiments.

FIG. 6A illustrates a side view of an LED assembly, in accordance with some embodiments. The LED assembly 600 may correspond to any of the LED assemblies 515, 520, and 525 illustrated in FIG. 5. The LED assembly 600 comprises a substrate structure having formed thereon a plurality of contacts. The substrate structure (hereinafter also referred to as an epitaxial structure) may comprise a semiconductor structure including an n-type layer 605 (e.g., an n-type substrate), a p-type layer 610 (e.g., a p-type substrate), and an active region which comprises one or more quantum wells (QW) 615 between the n-type layer 605 and the p-type layer 610. In some embodiments, the n-type and p-type layers may comprise n-type gallium nitride (nGaN) and p-type GaN (pGaN) respectively, although it is understood that in other embodiments other type of materials may be used. The Quantum Well material may comprise indium gallium nitride (InGaN), according to some embodiments. In some embodiments, the semiconductor structure of the LED assembly 600 including the n-type layer 605, quantum well material 615, and p-type layer 610 is an epitaxial structure grown on a growth substrate, for example Sapphire, SiC, bulk GaN, etc. Although FIG. 6A illustrates the LED assembly 600 as a particular shape (e.g., rectangular), it is understood that in some embodiments, the LED assembly 600 may be formed into a different shape (e.g., shaped into one or more mesas or other structures). Assembly 600 does not show the original substrate (sapphire, SiC, bulk GaN, etc) as it is assumed that it was removed or partially removed to expose the conductive n-type or unintentionally doped (UID) layer, for example n-GaN.

Figure 6B:
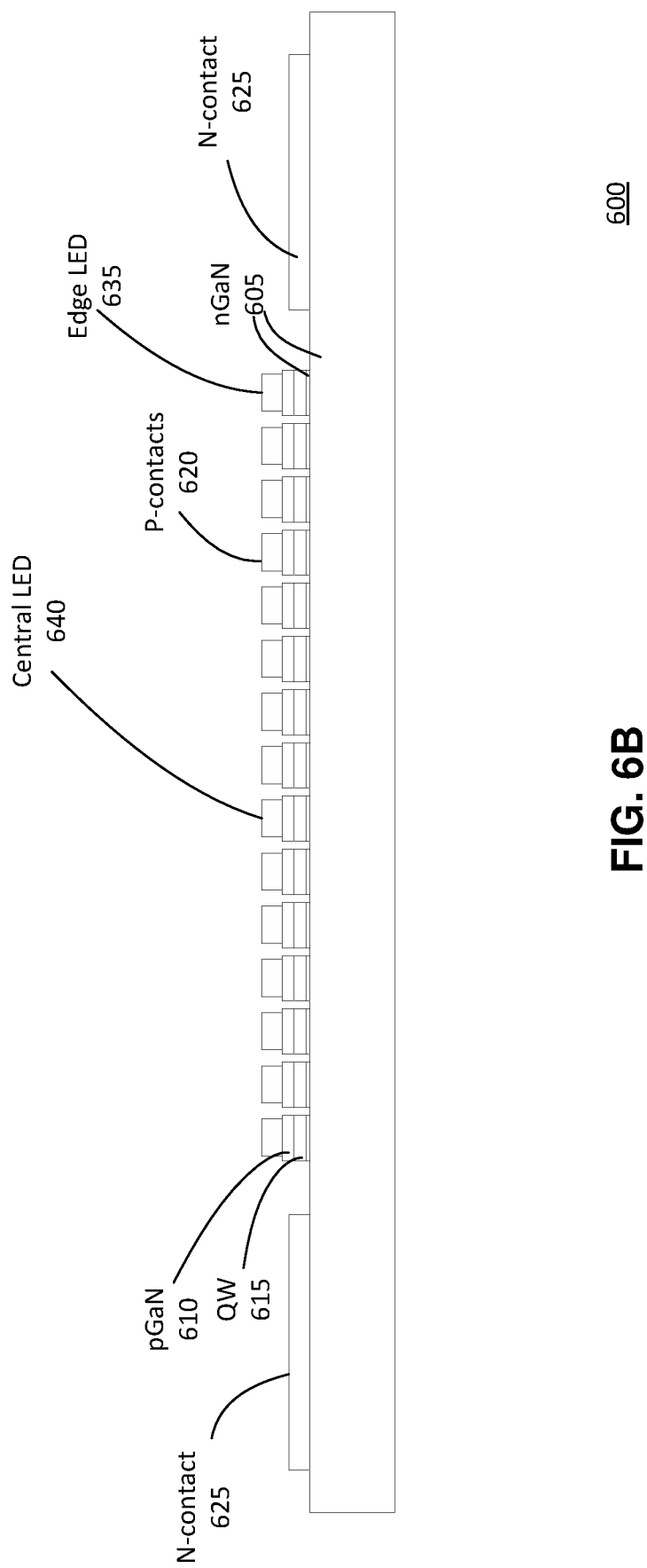
FIG. 6B illustrates a side view of another LED assembly, in accordance with some embodiments.

The LED assembly 600 further includes a plurality of p-contacts 620 on the p-type layer 610, and one or more n-contacts 625 on the n-type layer 605. In some embodiments, the LED assembly 600 is a flip-chip LED assembly where the contacts of the LEDs are on the same side of the substrate. As illustrated in FIG. 6A, the p-contacts 620 of the LED assembly 600 may be disposed on a common p-type layer 610 and quantum well material 615. In some embodiments, the pixels are defined by the p-contacts and in other embodiments, they are defined by p-contacts and etched or partially etched p-type layers, quantum well material and n-type layers. For example, FIG. 6B illustrates a side view of another LED assembly, in accordance with some embodiments. The sideview is of the LED assembly of FIG. 6B is similar to that of FIG. 6A, but where the LEDs are etched or partially etched into mesas. As illustrated in FIG. 6B, each LED (corresponding to a p-contact 620) is formed on a mesa comprising p-type material 610 (e.g., pGaN) and quantum well material 615, instead of on a single p-type layer and quantum well layer as illustrated in FIG. 6A. While the following figures may, for convenience, illustrate LED assemblies where the p-contacts are located on a common p-type and quantum well layer as illustrated in FIG. 6A, it is understood that the structures and concepts discussed can also be applied to the architecture illustrated in FIG. 6B with the p-contacts located on mesas. It is also understood that in some other embodiments, instead of each p-contact being formed on a separate mesa, multiple LEDs may be formed on a single mesa.

Because the number of p-contacts 620 in the LED assembly 600 may exceed the number of n-contacts 625, multiple p-contacts 620 may be operated by current between the p-contacts 620 and a particular n-contact 625. In some cases, such an arrangement may be used to save space on the LED assembly 600 and/or to produce a more compact arrangement of LEDs, since a large number of LEDs of the assembly 600 will share the same n-contact 625, instead of requiring individual n-contacts for each LED. While FIGS. 6A and 6B illustrate the p-contacts 620 arranged in a linear arrangement, the p-contacts 620 may be arranged in a two-dimensional matrix, or some other arrangement. In some embodiments, each LED of the LED assembly (corresponding to a respective p-contact) has a surface area of 10 um$^2$ or less.

During operation of the LED assembly 600, each LED receives a set amount of current which adds up to a total current 630 which flows between the p-contacts 620 and the n-contact 625, causing a voltage difference between each of the p-contacts 620 and the n-contact. The quantum well material 615 defines an active light emitting area of the LED assembly 600. For example, a portion of the quantum well material 615 associated with each p-contact 620 may emit light based upon an amount of current flowing through the corresponding p-contact 620. Light emitted in a direction away from the p-contacts 620 (e.g., through the n-type layer 605) may form the light emission of the LED assembly 600 (e.g., the source light 420 of FIG. 4). Because the light emitted by the LEDs passes through the n-type layer 605, the n-type layer 605 is formed to be optically transparent or partially transparent. In some embodiments, reflective material (not shown) may be disposed on a side of the LED assembly 600 having the p-contacts 620, in order to reflect additional light towards the n-type layer 605, directionalizing the light and increasing the brightness level of the light output by the LED assembly 600. The p-contacts 620 are individually addressable, allowing for operation of individual LEDs with the LED assembly in accordance with received imaging signals.

In some embodiments, the LED assembly is a microLED assembly, wherein each p-contact 620 corresponds to a μLED. The feature size of each μLED (e.g., the diameter) may range from sub-micrometers to tens of micrometers (e.g., from 0.1 μm to 10 μm). The pitch of the LED assembly 600 (e.g., spacing between μLEDs) may range from sub-micrometers to tens of micrometers. Each μLED may correspond to a pixel or sub-pixel of a display.

In some embodiments the p-GaN, quantum well material, and n-GaN is etched or partially etched to further the LED current confinement (e.g., as illustrated in FIG. 6B). While subsequent figures may illustrate the p-contacts defining pixels of the LED assembly on a common p-layer as illustrated in FIG. 6A, it is understood that the discussed structures and concept can also be applied on LED assemblies where the p-layer, quantum well material, and p-layer are etched or partially etched (e.g., formed into mesas as illustrated in FIG. 6B).

As shown in FIGS. 6A and 6B, when an LED assembly 600 contains an array of LEDs sharing a smaller number of n-contacts, the distance between p-contacts and n-contacts may be different for different LEDs of the array. For example, FIGS. 6A and 6B illustrate an edge LED 635 corresponding to an LED near the edge of the LED array that is close to an n-contact 625, and a central LED 640 corresponding to an LED near the center of the LED array that has a farther distance to the nearest n-contact 625 of the LED assembly.

These different distances between n-contact and p-contact for the LEDs of the LED assembly 600 may create a current crowding problem. For example, in order to turn on the LEDs of the LED assembly, current 630 has to spread from the n-contacts 625 through the n-type layer 605 to the farthest LEDs of the LED assembly. When most LEDs are turned on, a large current flows through the n-side, and, in the case of the center LED, the current has to go through a longer distance to reach the center LED than the edge LED. Since the nGaN layer has a finite resistance, and that voltage scales with distance, the voltage will be higher for the center LED than for the edge LED. This increased voltage level may be unacceptable for the back plane electronics of the LED assembly to handle, and may also lead to increase power consumption. This problem may be significant for displays in which the distance between the n-contacts 625 to the farthest LEDs of the LED assembly (e.g., the central LED 640) can be many millimeters.

Led Assembly with Conductive Layer

Figure 7:
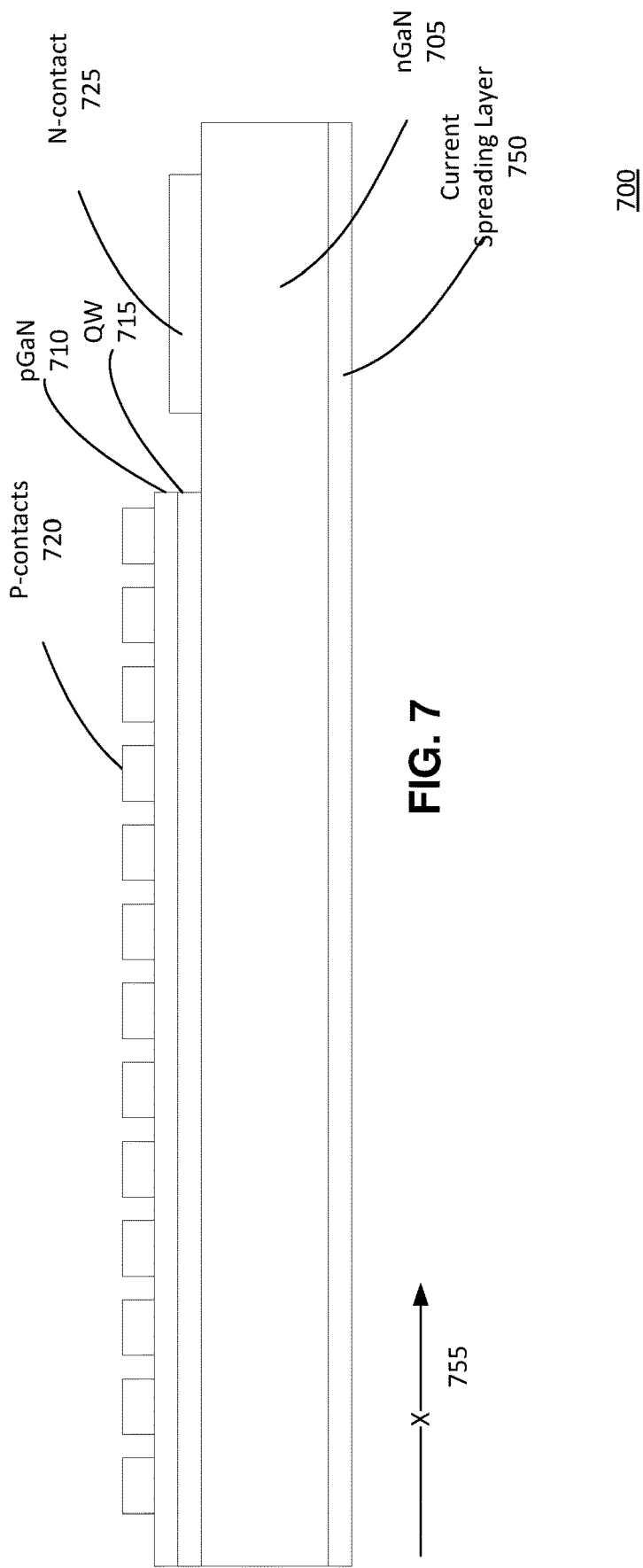
FIG. 7 illustrates a side view of a portion of an LED assembly having a current spreading layer, in accordance with some embodiments.

FIG. 7 illustrates a side view of a portion of an LED assembly having a current spreading layer, in accordance with some embodiments. Although the LED assembly 700 as illustrated in FIG. 7 only shows a single n-contact 725 on one side of the array of p-contacts 720 (arranged on a common p-type layer 710 and layer of quantum well material 715, similar to as illustrated in FIG. 6A), in some embodiments, the LED assembly 700 may comprise multiple n-contacts, which may be arranged on any side of the array of p-contacts (e.g., similar to the LED assembly 600 illustrated in FIGS. 6A and 6B).

The LED assembly 700 comprises a current spreading layer (e.g., comprising conductive oxide material) deposed on a surface of the semiconductor structure of the LED assembly 700. For example, the current spreading layer 750 may be disposed on a surface of the n-type layer 705 opposite from the n-contact 725 and p-contacts 720 of the LED assembly 700. In some embodiments, the LED assembly 700 is initially formed on a growth substrate such as sapphire substrate, and the current spreading layer 750 is disposed on the n-type layer 705 after removal of the LED assembly 700 from the sapphire substrate. In some embodiments, the current spreading layer 750 is formed using a conductive oxide material, and as such may also be referred to as a "conductive oxide layer." For example, the current spreading layer may comprise an indium tin oxide (ITO). In other embodiments, the current spreading layer may comprise silicon, aluminum, germanium, indium, and/or an alloy.

The current spreading layer 750 forms a conductive path between the n-contacts and p-contacts of the LED assembly 700, lowering the voltage difference required for current to flow between the n-contacts and p-contacts of the farthest LEDs of the LED assembly 700.

Figure 8A:
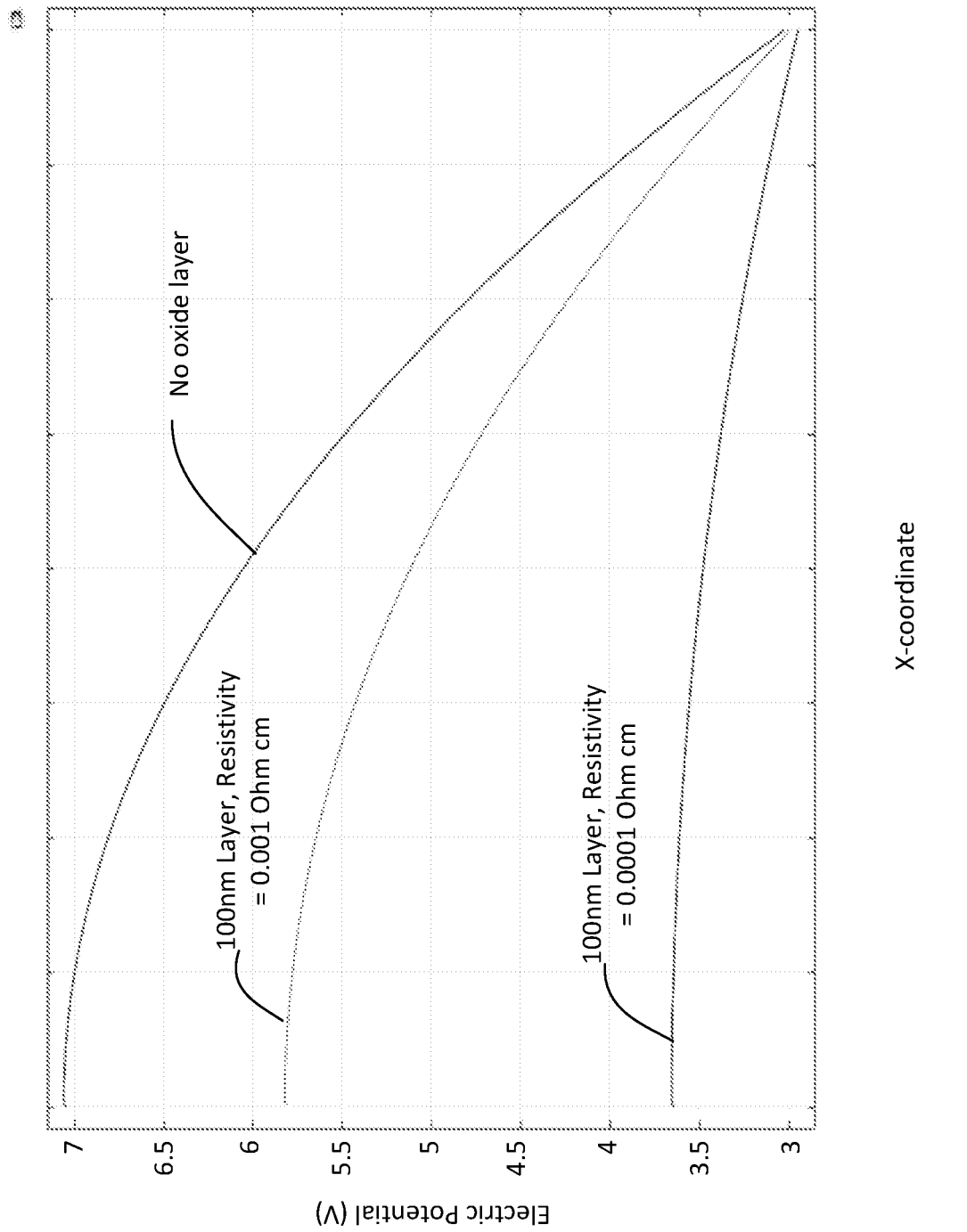
FIGS. 8A-8C are graphs illustrating how different properties of the current spreading layer affect voltage difference in an LED assembly, in accordance with some embodiments.
Figure 8B:
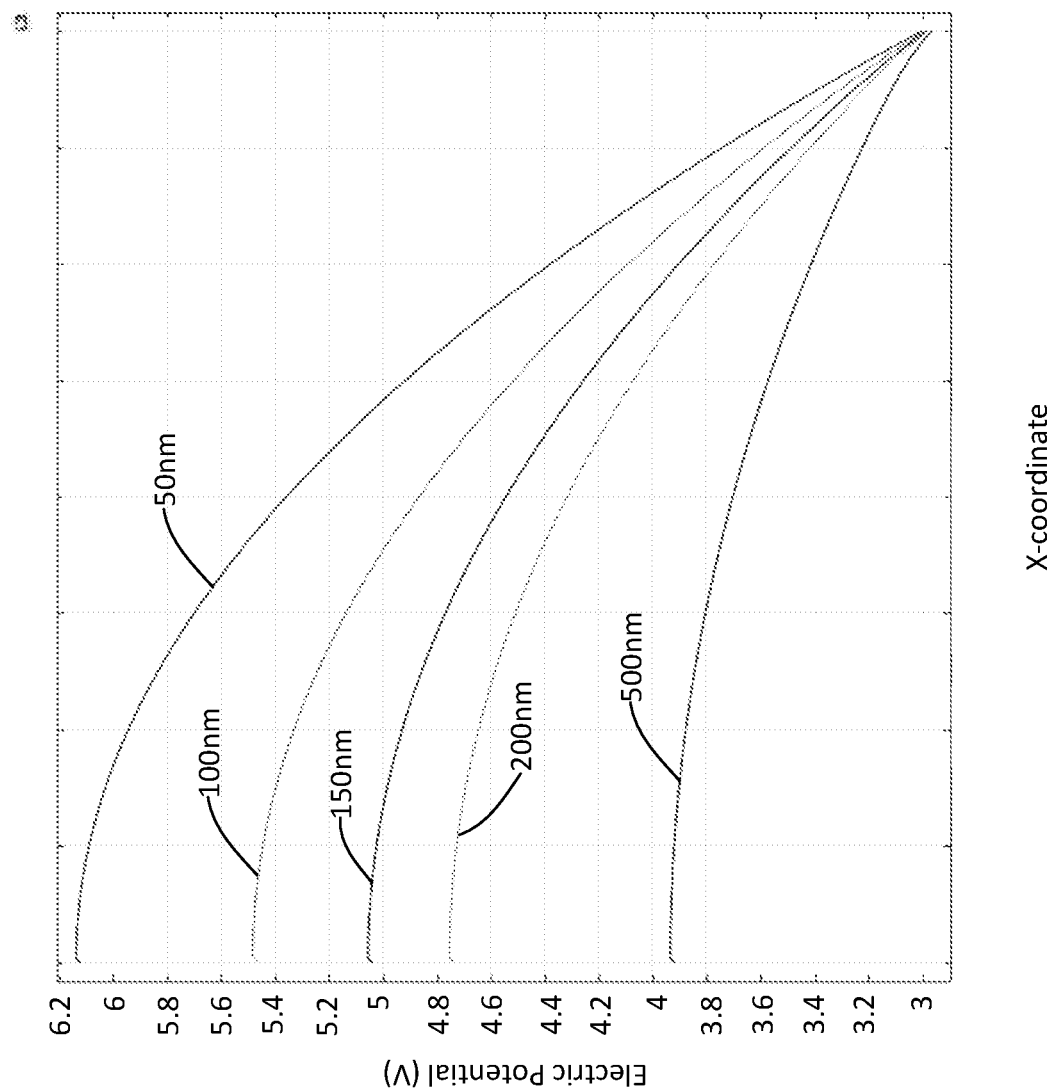
Figure 8C:
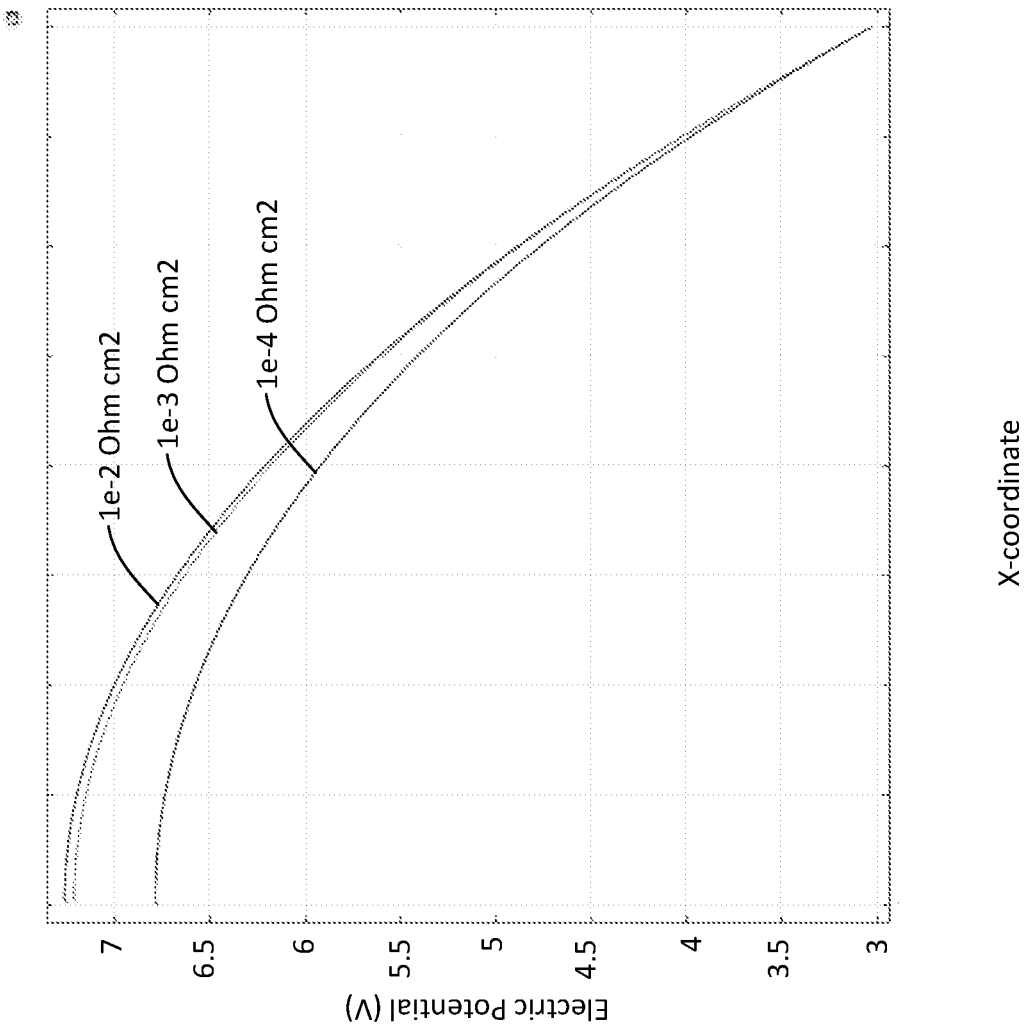

FIGS. 8A-8C are graphs illustrating how different properties of the current spreading layer affect voltage difference in an LED assembly, in accordance with some embodiments. The results illustrated in FIGS. 8A-8C were obtained through simulations and should show qualitative trends. Each of the graphs illustrated in FIGS. 8A-8C has an x-axis corresponding to an x-coordinate along a length of the LED assembly, as illustrated by the x-axis 755 of the LED assembly 700 of FIG. 7, from a location of a farthest LED from an n-contact of the LED assembly to a location of the n-contact. The y-axis of each graph indicates a voltage induced at each LED of the LED assembly when a current density of 10 A/cm' is applied on every LED at particular positions along the x-axis. The LED assembly used to produce the simulated results illustrated in the graphs of FIGS. 8A-8C has an n-type substrate layer of nGaN that is 3 um thick, with a current spreading layer (for example a conductive oxide layer, such as ITO).

FIG. 8A is a graph showing how resistivity of the current spreading layer affects the voltage needed to achieve a current density of 10 A/cm2 for LEDs at different locations of an LED array. The graph 800 contains a first curve illustrating voltage drop for LEDs at various locations along the x-axis when the LED assembly has no ITO layer, a second curve illustrating voltage drop when the LED assembly has a 100 nm thick ITO layer having a resistivity of 0.001 Ohm cm, and a third curve illustrating voltage drop for the LED assembly having a 100 nm thick ITO layer with a resistivity of 0.0001 Ohm cm. As observed in the graph 805, the lower the resistivity of the current spreading layer, the lower the difference in voltage of the different LEDs of the LED assembly. In some embodiments, the resistivity of the current spreading layer can be tuned or optimized based on the growth conditions of the conductive oxide used to form the current spreading layer. For example, the conductivity of the current spreading layer may be related to oxygen vacancies within the conductive oxide material (e.g., ITO). However, in some embodiments, there may be a trade-off between the conductivity and transparency of the current spreading layer that can be achieved, as more conductive ITO films tend be have less transparency.

FIG. 8B is a graph showing how thickness of the current spreading layer affects voltage level for LEDs at different locations of the LED assembly. The graph 810 contains curves corresponding to different thicknesses (50 nm, 100 nm, 150 nm, 200 nm, and 500 nm) of the ITO layer having a resistivity of 0.0007 Ohm cm. As observed in the graph 810, a thicker ITO layer corresponds to a lower voltage difference between the LEDs of the LED assembly. In some embodiments, for a given resistivity, a necessary thickness for achieving a maximum voltage difference between LEDs that are farthest and closest to an n-contact (e.g., middle LEDs and edge LEDs). For example, in some embodiments, for a certain resistivity, a necessary thickness to achieve a maximum voltage difference between middle and edge LEDs of 0.5V or less can be determined.

FIG. 8C is a graph showing how contact resistance of the current spreading layer affects voltage level for LEDs at different locations of the LED assembly. The graph 820 is based upon an LED assembly having a 100 nm thick current spreading layer having a resistivity of 0.001 Ohm cm, and contains curves corresponding to different contact resistance levels: 1e-2 Ohm cm$^2$, 1e-3 Ohm cm$^2$, and 1e-4 Ohm cm$^2$. In some embodiments, the contact resistivity is controlled by the interface between the current spreading layer (e.g., ITO) and the n-type layer (e.g., nGaN). For example, impurities and/or defects may increase or decrease the contact resistance. However, in some embodiments, the effect of contact resistance on voltage level is not strong, due to the large contact area between the current spreading layer and n-type layer.

As such, as illustrated in FIGS. 8A, 8C, and 8C, the voltage level for LEDs at different locations in the LED array may be adjusted by configuring the parameters of the current spreading layer (e.g., thickness, resistivity, and/or contact resistivity). In some embodiments, the thickness, resistivity, and contact resistivity of the current spreading layer are optimized such that the voltage penalty (indicating a difference in voltage level between the central and edge LEDs of the LED array) is less than a predetermined value (e.g., 0.5V).

In some embodiments, such as that illustrated in FIG. 7, the current spreading layer is formed on a surface (hereinafter referred to as the back surface) of the LED assembly substrate (e.g., the n-type substrate) opposite from the surface on which the contacts are formed, as a layer of substantially uniform thickness. In some embodiments, the current spreading layer covers the entire back surface of the LED array, or all of a portion of the back surface that encompasses the p-type and n-type contacts of the LED assembly. In such embodiments, because the light emitted by the LEDs of the LED assembly is emitted through the back surface of the LED assembly, the current spreading layer will need to be light transmissive or partially transmissive (e.g., above a threshold level of transparency for light within a particular wavelength range), in order to allow light from the LEDs (e.g., originating from the quantum well material) to be emitted from the LED assembly. In some embodiments, the current spreading layer is configured to have a resistivity of 0.001 Ohm cm or lower, a thickness of at least 50 nm, a contact resistance of 0.01 Ohm cm$^2$ or lower, and a transparency of at least 80% in the wavelength range of 400 nm-700 nm.

Figure 9A:
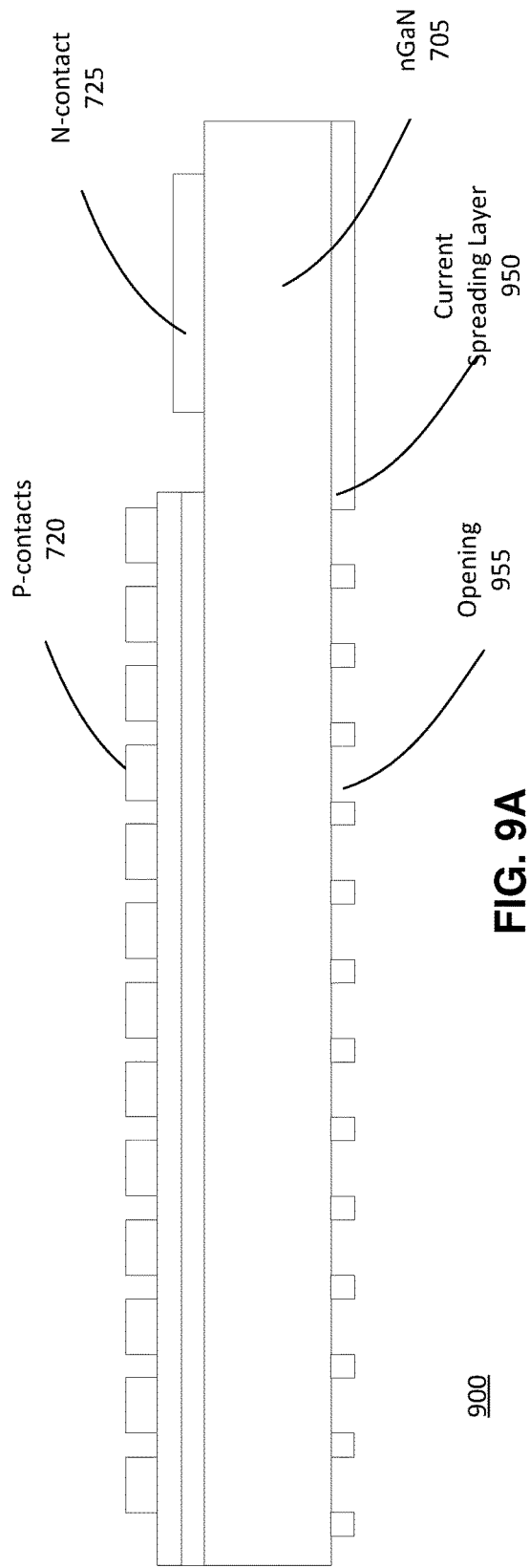
FIG. 9A illustrates a side cross-sectional view of an LED assembly having a patterned current spreading layer in accordance with some embodiments.
Figure 9B:
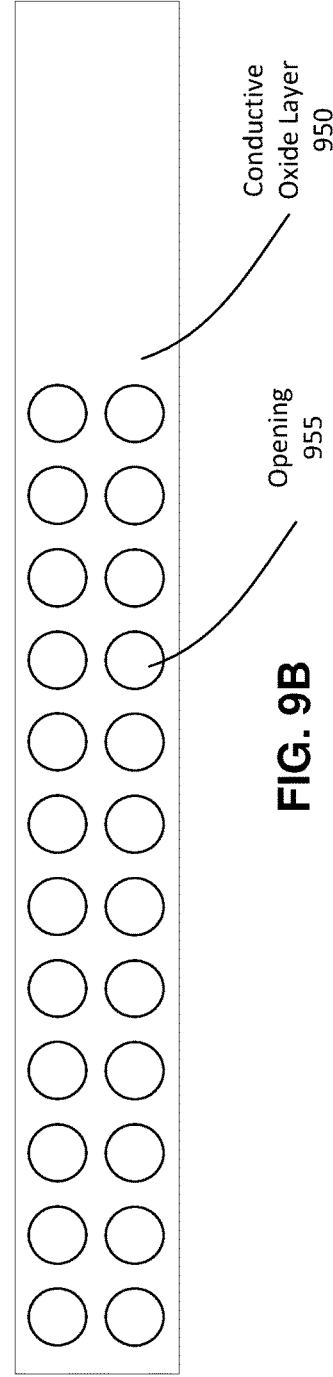
FIG. 9B illustrates a frontal view of the patterned current spreading layer used in FIG. 9A.

In some embodiments, the current spreading layer may be formed with a different structure. For example, in some embodiments, the current spreading layer of the LED assembly is shaped to improve light extraction. FIG. 9A illustrates a side cross-sectional view of an LED assembly having a patterned current spreading layer in accordance with some embodiments. FIG. 9B illustrates a frontal view of the patterned current spreading layer used in FIG. 9A. The LED assembly 900 is similar to the LED assembly 700 of FIG. 7. However, the current spreading layer 950 formed on the back surface of the n-type layer 705 includes a plurality of openings 955 (e.g., facing the LEDs). The openings 955 are configured to correspond to locations of the LEDs of the LED assembly 900 (e.g., corresponding to the locations of the p-contacts 720). This allows light emitted from each of the LEDs to exit the LED assembly without needing to pass through the material of the current spreading layer, potentially improving light extraction. The current spreading layer 950 illustrated in FIG. 9B shows openings 955 corresponding to two rows of LEDs of an LED array. However, in other embodiments, the current spreading layer 950 may comprise one row of openings 955, or additional rows of openings 955 corresponding to additional rows of LEDs.

In some embodiments, the current spreading layer may be formed to include two or more different materials. FIG. 10A illustrates a side cross-sectional view of an LED assembly having a patterned current spreading layer having a second, fill material, in accordance with some embodiments. FIG. 10B illustrates a frontal view of the patterned current spreading layer used in FIG. 10A. The current spreading layer 1050 of the LED assembly 1000 is similar to the current spreading layer 950 illustrated in FIG. 9, containing a plurality of openings 1055. The fill material 1060 may be disposed within the openings 1055 formed in the patterned current spreading layer 1050 corresponding to p-contacts of the LED assembly. As such, light emitted from the LEDs may pass through the fill material 1060 instead of the current spreading to exit the LED assembly. In some embodiments, the fill material 1060 may have a different thickness compared to the current spreading material (e.g., conductive oxide) of the current spreading layer. In other embodiments, the fill material 1060 is formed to have the same thickness the current spreading material. In addition, in some embodiments, the openings 1055 within the current spreading layer may be sized differently from the LEDs of the LED array (e.g., larger or smaller), or be aligned differently relative to the LEDs. For example, in some embodiments, light extraction of the LED assembly may be enhanced due to scattering of light within the pattern defined by the openings 1055 and or fill material 1060. In addition, while FIG. 10 illustrates each of the openings 1055 corresponding to one LED of the LED array, it is understood that in some embodiments, an LED may correspond to multiple openings, or a single opening may corresponding to multiple LEDs.

In some embodiments, the fill material 1060 may have different optical and/or electrical properties compared to those of the current spreading layer. For example, the fill material 1060 may be selected to have greater optical transparency in comparison to the current spreading material (e.g., conductive oxide), but may have higher resistivity. In some embodiments, the fill material 1060 may be a non-conductive material.

In addition, while FIGS. 10A and 10B illustrate the fill material 1060 having a particular shape, in some embodiments, the fill material may be shaped to enhance light extraction and collimation. For example, the fill material 1060 may be shaped to form a microlens, a nanostructure, or other type of optical structure.

While FIGS. 9A-9B and 10A-10B illustrate the current spreading layer having a particular patterning (e.g., circular openings corresponding to the locations of LEDs of the LED assembly), it is understood that in other embodiments, the current spreading layer may exhibit other types of patterning, such as different opening sizes and/or shapes, different pattern locations, areas of different layer thickness instead of or in addition to openings, etc.

Figure 11A:
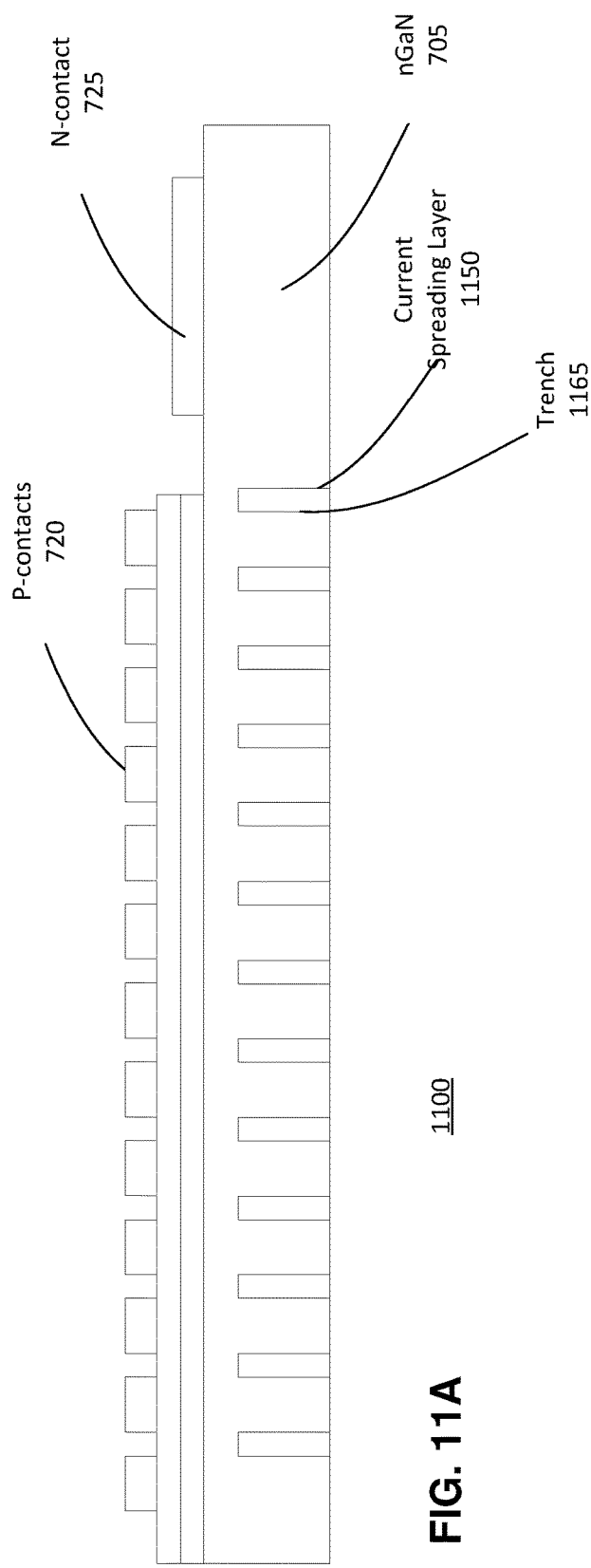
FIG. 11A illustrates a side cross-sectional view of an LED assembly having a patterned current spreading layer formed on a non-planar surface of the LED assembly substrate, in accordance with some embodiments.
Figure 11B:
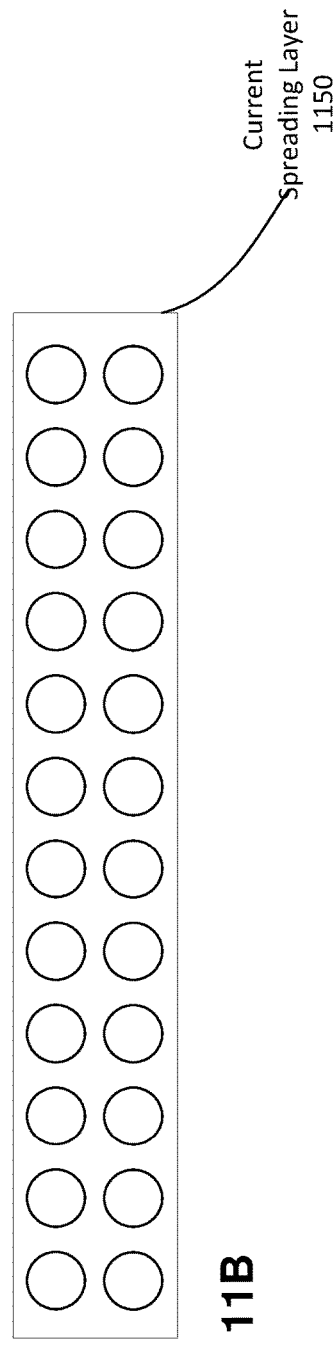
FIG. 11B illustrates a frontal view of the patterned current spreading layer used in FIG. 11A.

While the above figures illustrate the current spreading layer formed on a flat surface of the LED assembly substrate (e.g., the nGaN substrate), in some embodiments, the current spreading layer can be formed on a non-flat or patterned surface of the substrate. FIG. 11A illustrates a side cross-sectional view of an LED assembly having a patterned current spreading layer formed on a non-planar surface of the LED assembly substrate, in accordance with some embodiments. FIG. 11B illustrates a frontal view of the patterned current spreading layer used in FIG. 11A. As shown in FIG. 11A, the n-type layer 705 of the LED assembly 1100 is etched to form one or more trenches 1165, whereupon the current spreading layer 1150 is formed by depositing conductive oxide material into the one or more trenches 1165. In some embodiments the one or more trenches 1165 may be formed between the LEDs of the LED assembly 1100, in order to minimize effects of cross talk between adjacent pixel and maximize light extraction 1150. By forming the current spreading layer 1150 within trenches 1165 etched into the substrate of the LED assembly 1100, a thickness of the current spreading layer may be increased (while reducing or eliminating an increase in thickness of the LED assembly as a whole), while also decreasing contact resistance between the material of the current spreading layer (e.g., conductive oxide) and the n-type layer (e.g., nGaN) due to a larger surface contact area between the current spreading material and the n-type layer 705. This may reduce the voltage drop between the farthest LEDs and the closest LEDs to the n-contact of the LED assembly.

Figure 11C:
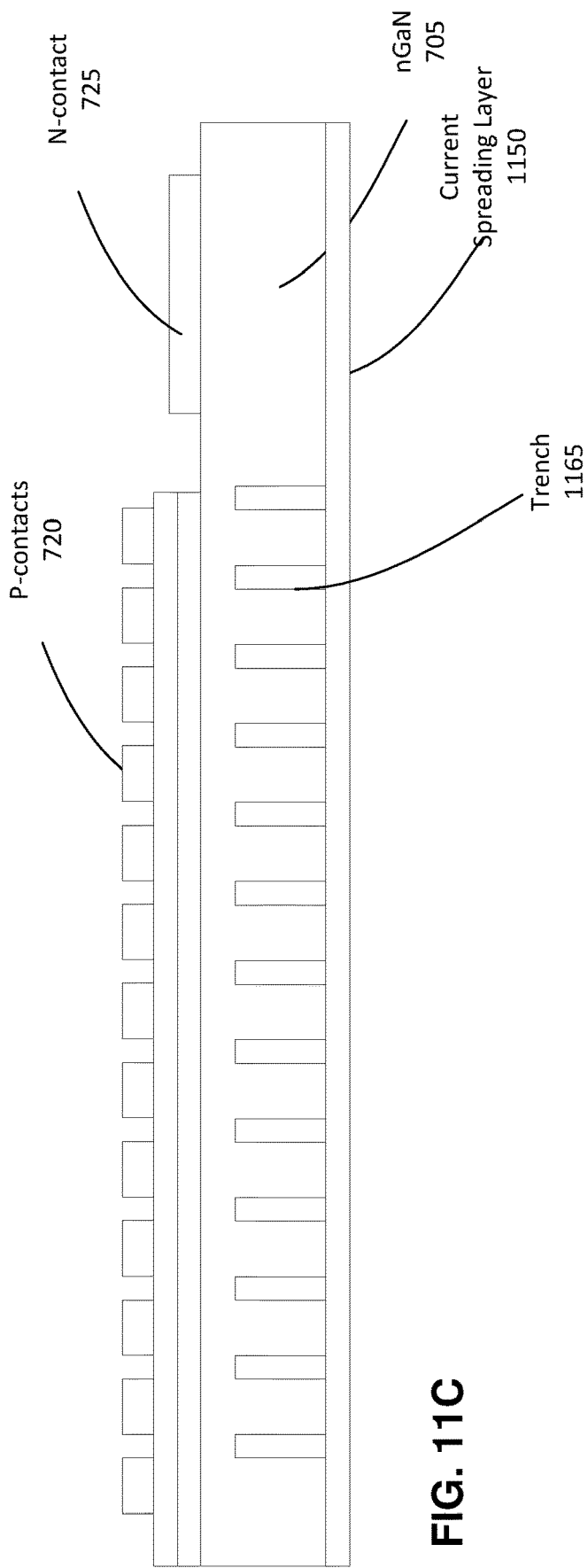
FIG. 11C illustrates a side cross-sectional view of another LED assembly having a patterned current spreading layer formed on a non-planar surface of the LED assembly substrate, in accordance with some embodiments.

FIG. 11C illustrates a side cross-sectional view of another LED assembly having a patterned current spreading layer formed on a non-planar surface of the LED assembly substrate, in accordance with some embodiments. The current spreading layer 1150 of FIG. 11C is similar to the current spreading layer of FIG. 11A, but further includes an additional layer of current spreading material (e.g., conductive oxide) formed over the back surface of the substrate and covering the trenches formed in the substrate.

Figure 12:
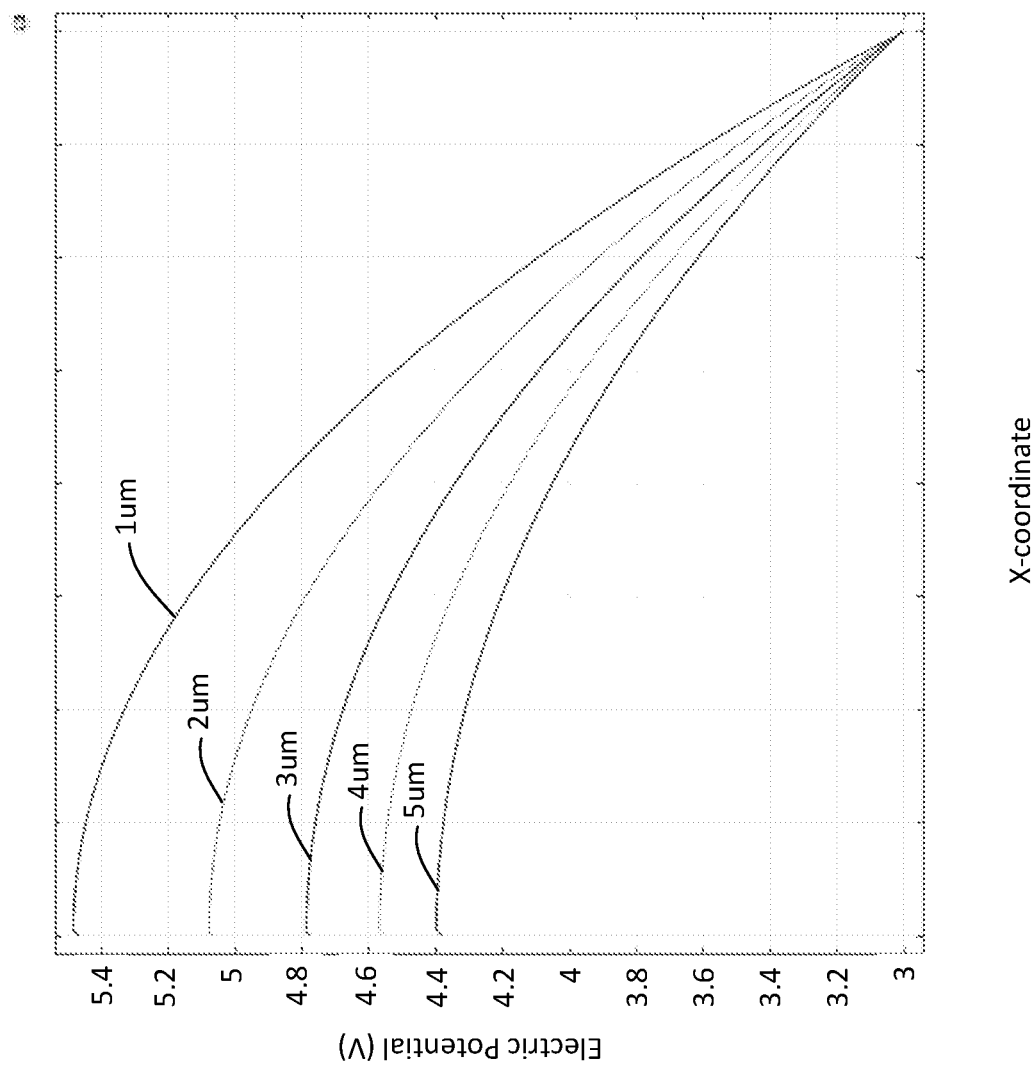
FIG. 12 illustrates a graph showing voltage drops across an LED assembly for different n-type substrate thicknesses, in accordance with some embodiments.

In some embodiments, the n-type substrate layer (e.g., nGaN) of the LED assembly is formed epitaxially on a growth substrate (e.g., a crystalline substrate such as a sapphire substrate). The thickness of the n-type substrate is controlled by the epitaxy and grinding of the n-type substrate subsequent to removal from the growth substrate. In some embodiments, the thickness of the n-type substrate may be selected to achieve a desired voltage drop between the farthest and nearest LEDs of the LED assembly. FIG. 12 illustrates a graph showing voltage drops across an LED assembly for different n-type substrate thicknesses, in accordance with some embodiments. The data of the graph 1200 assumes an LED assembly having an nGaN substrate and a current spreading layer having a resistivity of 0.0007 Ohm cm and a uniform thickness of 200 nm, and illustrates curves corresponding to nGaN thicknesses of 1 um, 2 um, 3 um, 4 um, and 5 um. As illustrated in FIG. 12, a thicker nGaN results in a lower voltage difference. Therefore, the thicknesses of the n-type substrate and the current spreading layer may be balanced in order to achieve a desired voltage difference between LEDs near the middle of the LED assembly and LEDs on the edge.

Figure 13:
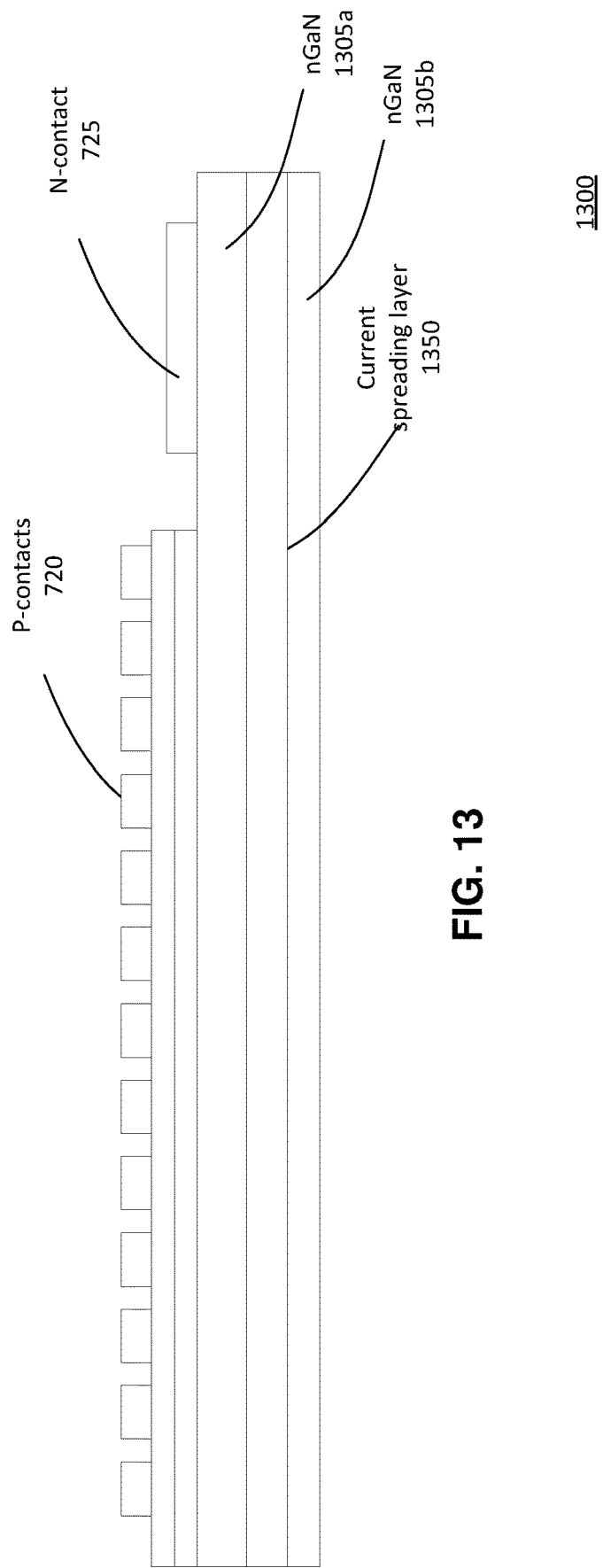
FIG. 13 illustrates a side cross-sectional view of an LED assembly having a multi-layered substrate, in accordance with some embodiments.

In some embodiments, current spreading layer may be formed as part of a multi-layer epitaxial stack during formation of the n-type substrate of the LED assembly. FIG. 13 illustrates a side cross-sectional view of an LED assembly having a multi-layered substrate, in accordance with some embodiments. As illustrated in FIG. 13, the conductive layer 1350 of the LED assembly 1300 is formed between a first nGaN layer 1305a and a second nGaN layer 1305b. In some embodiments, the current spreading layer 1350 is formed as part of an epitaxial stack during the formation of the nGaN layers comprising nGaN layers 1305a and 1305b. In some embodiments, the current spreading layer 1350 may comprise a conductive oxide material. In some embodiments, the current spreading layer 1350 comprises a highly-doped GaN layer or a GaN superlattice (e.g., InGaN, AlGaN) that provides increased lateral conductivity. The current spreading layer 1350 has a lower resistivity in comparison to the surrounding nGaN layers 1305a and 1305b, helping to spread current and reduce a voltage difference between LEDs in the middle of the array and LEDs near the edge during operation of the LED assembly. In some embodiments, the current spreading layer 1350 is formed using ion implantation after the nGaN layer (e.g., nGaN layers 1305 and 1310) is formed. For example, the ions may be implanted at a specified depth within the nGaN layer to form the current spreading layer 1350.

In some embodiments, the substrate of the LED assembly may comprise additional layers. For example, in some embodiments, a two-dimensional electron gas (2DEG) may be introduced to the layer stack during epitaxial deposition. In some embodiments, a 2DEG may appear in areas where the conduction band cross a fermi level, and may be induced at an AlGaN/GaN or InGaN/AlGaN interface, or other similar interface. In some embodiments, the lower resistivity current spreading layer 1350 may also function as an etch stop to enable control of the thickness of the nGaN layer. For example, the nGaN substrate of the LED assembly may be etched in order for light extraction or other purposes, wherein the conductive layer serves as a stop limiting a depth of the etching.

Through the use of current spreading layers to spread current across the substrate of an LED assembly, the LED assembly may be able to have a large array of LEDs spread over a larger area, while maintaining a voltage drop needed to drive the LEDs at or below a desired level. This may allow for the manufacture of higher resolution LED arrays.

Process Flow

Figure 14:
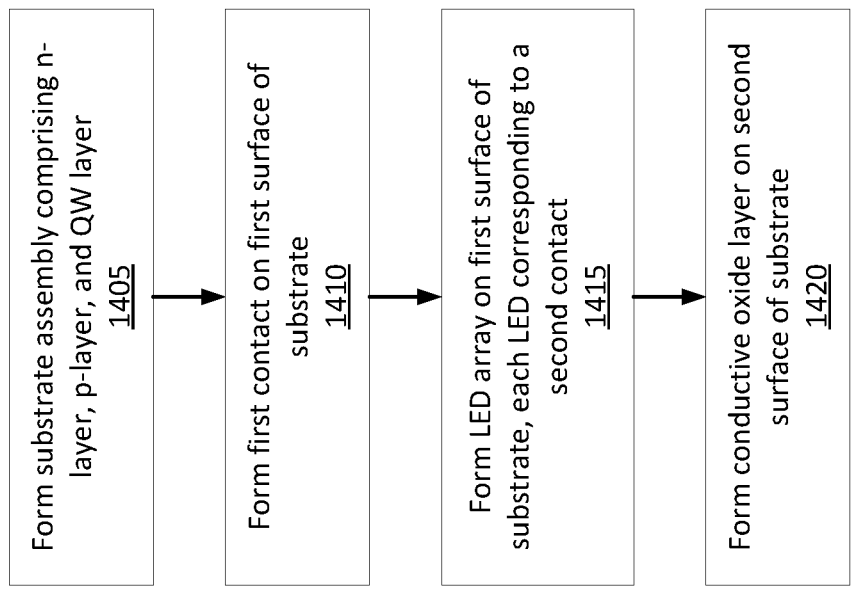
FIG. 14 is a flowchart of a process for manufacturing an LED assembly having a current spreading layer, in accordance with some embodiments.

FIG. 14 is a flowchart of a process for manufacturing an LED assembly having a current spreading layer, in accordance with some embodiments. The process of FIG. 14 may be performed by a manufacturing system.

The system 1405 forms an epitaxial LED structure (e.g., a substrate assembly). In some embodiments, the epitaxial structure is formed by depositing a plurality of epitaxial layers (e.g., comprising an n-type layer, quantum well layer, and p-type layer) onto a base substrate (e.g., sapphire).

The system forms 1410 an LED array on the first surface of the p-type layer of the epitaxial structure, each LED corresponding to a respective contact (e.g., p-contact) formed on the first surface of the p-layer. The LEDs may be formed on a p-layer and quantum well formed on the first surface of the n-layer. The first surface may correspond to a surface of the epitaxial layer opposite from the base substrate.

The system forms 1415 one or more contacts (e.g., n-contacts) on a first surface of the n-type layer of the epitaxial structure. In some embodiments, access to the n-type layer of the epitaxial structure is fabricated (e.g., by removing portions of the p-type layer and/or quantum well layer) to expose a portion of the n-type layer, whereupon the one or more contacts are formed on the exposed surface portion of the n-type layer.

As such, each LED of the array of LEDs can be addressed by an individual electrical contact (e.g., p-contact) on the first surface of the p-type layer, and can emit light when current is applied between the p-contact and one or more of the n-contacts formed on the n-type layer.

The system forms 1420 a current spreading layer (e.g., a conductive oxide layer) on a second surface of the substrate. In some embodiments, the second surface of the substrate is exposed after the substrate is removed from the base substrate on which it was formed. In other embodiments, the current spreading layer is formed as a layer of multi-layer stack during formation of the substrate, and may be positioned between the substrate and a second substrate layer. In some embodiments, the current spreading layer is of substantially uniform thickness. In other embodiments, the current spreading layer is patterned and/or comprises one or more openings. In embodiments where the current spreading layer has one or more openings, the current spreading layer may include a second material (e.g., a fill material) within the one more openings. In some embodiments, the current spreading layer may be formed within one or more trenches or depressions formed on a surface of the substrate. The LED assembly having the current spreading layer may be attached to a backplane. The current spreading layer increases a level of current spread between the first contact (e.g., n-contact) and plurality of second contacts (e.g., p-contacts) corresponding to LEDs, reducing a voltage difference between different LEDs of the LED array during operation of the LED assembly.

During operation of the LED assembly, a current signal provided to the LED assembly (e.g., by a controller) based upon image data to be displayed. The current flows between the first and second contacts through the substrate of the LED assembly and the current spreading layer formed on a surface of the substrate, the current causing LEDs of the LED assembly to emit light in accordance with the provided current. The current spreading layer serves to more efficiently spread current from the n-contacts of the LED assembly to the p-contacts at varying distances from the n-contacts, reducing a voltage difference between p-contacts that are farther away and p-contacts that are closer to the n-contacts.

The language used in the specification has been principally selected for readability and instructional purposes, and it may not have been selected to delineate or circumscribe the inventive subject matter. It is therefore intended that the scope of the disclosure be limited not by this detailed description, but rather by any claims that issue on an application based hereon. Accordingly, the disclosure of the embodiments is intended to be illustrative, but not limiting, of the scope of the disclosure, which is set forth in the following claims.

What is claimed is:

1. A light emitting diode (LED) assembly comprising:
a substrate assembly comprising a first substrate of a first type, a layer of light emitting material, and a second substrate of a second type;
one or more contacts of a first type formed on a first surface of or within the first substrate;
an array of LEDs, wherein each LED of the array of LEDs corresponds to a respective contact of a second type formed on a first surface of the second substrate, the array of LEDs sharing the one or more contacts of the first type and configured to emit light when current is applied between the respective contacts of the second type and at least one of the one or more contacts of the first type; and
a current spreading layer formed on a second surface of the first substrate opposite to the first surface of or within the first substrate, wherein the current spreading layer reduces a voltage difference between different LEDs of the array of LEDs during operation of the LED assembly, and wherein the current spreading layer is formed with a plurality of openings.

2. The LED assembly of claim 1, wherein:
the first substrate of the first type is an n-type layer;
the second substrate of the second type is a p-type layer;
the one or more contacts of the first type are n-type contacts; and
the respective contact of the second type is a p-type contact.

3. The LED assembly of claim 1, wherein LEDs of the array of LEDs are further defined by etching or partially etching through the second substrate, the layer of light emitting material, and partially through the first substrate.

4. The LED assembly of claim 1, wherein the current spreading layer is transparent or partially transparent.

5. The LED assembly of claim 1, wherein the current spreading layer comprises a conductive oxide material.

6. The LED assembly of claim 5, wherein the conductive oxide material comprises indium tin oxide (ITO).

7. The LED assembly of claim 1, further comprising an optically transmissive material disposed within the plurality of openings.

8. The LED assembly of claim 1, wherein the plurality of openings correspond to locations of LEDs of the array of LEDs.

9. The LED assembly of claim 1, wherein the current spreading layer has a resistivity of 0.001 Ohm cm or less.

10. The LED assembly of claim 1, wherein the current spreading layer has a thickness of 50 nm or more.

11. A light emitting diode (LED) assembly comprising:
a substrate assembly comprising a first substrate of a first type, a layer of light emitting material, and a second substrate of a second type;
one or more contacts of a first type formed on a first surface of or within the first substrate;
an array of LEDs, wherein each LED of the array of LEDs corresponds to a respective contact of a second type formed on a first surface of the second substrate, the array of LEDs sharing the one or more contacts of the first type and configured to emit light when current is applied between the respective contacts of the second type and at least one of the one or more contacts of the first type; and
a current spreading layer formed on a second surface of the first substrate opposite to the first surface of or within the first substrate, wherein the current spreading layer reduces a voltage difference between different LEDs of the array of LEDs during operation of the LED assembly, and wherein the current spreading layer is formed within one or more trenches formed on the second surface of the first substrate.

12. The LED assembly of claim 11, wherein:
the first substrate of the first type is an n-type layer;
the second substrate of the second type is a p-type layer;
the one or more contacts of the first type are n-type contacts; and the respective contact of the second type is a p-type contact.

13. The LED assembly of claim 11, wherein LEDs of the array of LEDs are further defined by etching or partially etching through the second substrate, the layer of light emitting material, and partially through the first substrate.

14. The LED assembly of claim 11, wherein the current spreading layer is transparent or partially transparent.

15. The LED assembly of claim 11, wherein the current spreading layer comprises a conductive oxide material.

16. The LED assembly of claim 15, wherein the conductive oxide material comprises indium tin oxide (ITO).

17. The LED assembly of claim 11, wherein the one or more trenches are formed at locations on the second surface of the first substrate corresponding to spaces between adjacent LEDs of the array of LEDs.

18. The LED assembly of claim 11, wherein the current spreading layer has a resistivity of 0.001 Ohm cm or less.

19. The LED assembly of claim 11, wherein the current spreading layer has a thickness of 50 nm or more.

20. A light emitting diode (LED) assembly comprising:
a substrate assembly comprising a first substrate of a first type, a layer of light emitting material, and a second substrate of a second type;
one or more contacts of a first type formed on a first surface of or within the first substrate;
an array of LEDs, wherein each LED of the array of LEDs corresponds to a respective contact of a second type formed on a first surface of the second substrate, the array of LEDs sharing the one or more contacts of the first type and configured to emit light when current is applied between the respective contacts of the second type and at least one of the one or more contacts of the first type; and
a current spreading layer formed on a second surface of the first substrate opposite to the first surface of or within the first substrate, wherein the current spreading layer reduces a voltage difference between different LEDs of the array of LEDs during operation of the LED assembly, and wherein the current spreading layer comprises a first portion formed on the second surface of the first substrate, and a second portion formed within one or more trenches formed on the second surface of the first substrate.

* * * * *